US012581767B2

(12) United States Patent
Liao et al.

(10) Patent No.: US 12,581,767 B2
(45) Date of Patent: Mar. 17, 2026

(54) SOLAR CELL, TANDEM SOLAR CELL, AND PHOTOVOLTAIC MODULE

(71) Applicants:ZHEJIANG JINKO SOLAR CO., LTD., Zhejiang (CN); JINKO SOLAR (HAINING) CO., LTD., Haining (CN)

(72) Inventors: Guangming Liao, Zhejiang (CN); Yulin Wang, Zhejiang (CN); Jingsheng Jin, Zhejiang (CN); Xinyu Zhang, Zhejiang (CN)

(73) Assignees: ZHEJIANG JINKO SOLAR CO., LTD., Haining (CN); JINKO SOLAR (HAINING) CO., LTD., Haining City (CN)

( * ) Notice: Subject to any disclaimer, the term of this patent is extended or adjusted under 35 U.S.C. 154(b) by 0 days.

(21) Appl. No.: 18/646,490

(22) Filed: Apr. 25, 2024

(65) Prior Publication Data

US 2025/0255036 A1      Aug. 7, 2025

(30) Foreign Application Priority Data

Feb. 6, 2024      (CN) ......................... 202410172261.5

(51) Int. Cl.
*H10F 77/70*          (2025.01)
*H10F 10/161*          (2025.01)
(Continued)

(52) U.S. Cl.
CPC ......... *H10F 77/707* (2025.01); *H10F 10/161* (2025.01); *H10F 19/80* (2025.01); *H10F 77/215* (2025.01); *H10F 77/935* (2025.01)

(58) Field of Classification Search
CPC ...... H10F 77/707; H10F 10/161; H10F 19/80; H10F 77/215; H10F 77/935; H10F 10/14;
(Continued)

(56) References Cited

U.S. PATENT DOCUMENTS

2013/0025656 A1*    1/2013  Yang ....................... H10F 10/14
                                                                 136/255
2015/0024541 A1      1/2015  Jaffrennou et al.

FOREIGN PATENT DOCUMENTS

CN          104170095 A      11/2014
CN          104465867 A  *  3/2015  ............. H10F 71/00
(Continued)

OTHER PUBLICATIONS

Machine translation of CN 104465867 A (Year: 2025).*
(Continued)

*Primary Examiner* — Angelo Trivisonno
(74) *Attorney, Agent, or Firm* — USCH Law, PC

(57)          ABSTRACT
Provided are a solar cell, a tandem solar cell, and a photovoltaic module. The solar cell includes a substrate, a doped conductive layer, and a dielectric layer. The substrate has a first surface, where the first surface includes electrode regions and non-electrode regions that are alternatingly arranged along a first direction. The doped conductive layer is formed over the first surface of the substrate. The doped conductive layer includes first conductive portions and at least one second conductive portion. Each first conductive portion is formed over a respective electrode region of the electrode regions, and each respective second conductive portion is formed over a part of a non-electrode region of the non-electrode regions The dielectric layer is between the first surface and the doped conductive layer.

20 Claims, 7 Drawing Sheets

(51) Int. Cl.
    *H10F 19/80*        (2025.01)
    *H10F 77/00*        (2025.01)
    *H10F 77/20*        (2025.01)

(58) Field of Classification Search
    CPC ...... H10F 19/40; H10F 77/703; H10F 77/211;
                H10F 10/142; H10F 10/146; H10F
                            77/311; H10F 71/121
    USPC ........................................................ 136/256
    See application file for complete search history.

(56) References Cited

FOREIGN PATENT DOCUMENTS

| | | | |
|---|---|---|---|
| CN | 205900558 | U | 1/2017 |
| CN | 112466967 | A | 3/2021 |
| CN | 114823951 | A | 7/2022 |
| CN | 218101278 | U | 12/2022 |
| CN | 115799358 | A | 3/2023 |
| CN | 115832105 | A | 3/2023 |
| CN | 116314372 | A | 6/2023 |
| CN | 116404071 | A | 7/2023 |
| CN | 116704071 | A | 9/2023 |
| CN | 116722050 | A | 9/2023 |
| CN | 116722051 | A | 9/2023 |
| CN | 116722060 | A | 9/2023 |
| CN | 116914019 | A | 10/2023 |
| CN | 117238987 | A | 12/2023 |
| DE | 202023101518 | U1 | 8/2023 |
| WO | 2015141326 | A1 | 9/2015 |

OTHER PUBLICATIONS

Zhejiang Jinko Solar Co., Ltd et al., Extended European Search Report, EP 24173355.9, Oct. 18, 2024, 94 pgs.

Zhejiang Jinko Solar Co., Ltd., Cn First Office Action, CN 2024101720662, Mar. 29, 2024, 13 pgs.

\* cited by examiner

SOLAR CELL, TANDEM SOLAR CELL, AND PHOTOVOLTAIC MODULE

CROSS REFERENCE TO RELATED APPLICATIONS

The present application claims the benefit of priority under the Paris Convention to Chinese Patent Application No. CN202410172261.5, filed on Feb. 6, 2024, which is incorporated by reference herein in its entirety.

TECHNICAL FIELD

Embodiments of the present disclosure relate to the field of photovoltaics, and in particular, to a solar cell, a method for preparing the same, a tandem solar cell, and a photo-voltaic module.

BACKGROUND

A current solar cell mainly includes an interdigitated back contact (IBC) cell, a tunnel oxide passivated contact (TOP-CON) cell, a passivated emitter and rear cell (Passivated emitter and rear cell, PERC), a heterojunction cell, and the like.

However, a current solar cell has a limited photoelectric conversion efficiency due to a limited wavelength range of light that the solar cell can absorb and utilize. Moreover, the difference in photoelectric conversion efficiency between the front surface and the back surface of the solar cell also affects the overall power generation of the solar cell. To further improve the photoelectric conversion efficiency of a solar cell, higher requirements are put forward for a light absorption rate of the solar cell and the photoelectric con-version efficiencies of the front surface and the back surface of the solar cell.

SUMMARY

Embodiments of the present disclosure provide a solar cell and a method for preparing the same, a tandem solar cell, and a photovoltaic module, which at least facilitates improving the light absorption rate of a first surface and improving the photoelectric conversion of the solar cell.

According to some embodiments of the present disclo-sure, an aspect of the embodiments of the present disclosure provides a solar cell. The solar cell includes a substrate, a doped conductive layer and a dielectric layer. The substrate has a first surface, and the first surface includes electrode regions and non-electrode regions that are alternatingly arranged along a first direction. The doped conductive layer is formed over the first surface of the substrate. The doped conductive layer includes first conductive portions and at least one second conductive portion. Each first conductive portion of the first conductive portions is formed over in a respective electrode region of the electrode regions, and each respective second conductive portion of the at least one second conductive portion is formed over a part of a non-electrode region of the non-electrode regions. The dielectric layer is between the first surface and the doped conductive layer. The first surface includes a first area aligned with the doped conductive layer and at least one second area that does not overlap with an orthographic projection of any part of the doped conductive layer, the first area has a first surface structure including a plurality of first pyramid structures, and each of the at least one second area has a second surface structure including a plurality of platform structures.

In some embodiments, the substrate further has a second surface opposite to the first surface, and the second surface has a third surface structure including a plurality of second pyramid structures.

In some embodiments, a bottom of a respective first pyramid structure of the plurality of first pyramid structures has a one-dimensional size smaller than a one-dimensional size of a bottom of a respective second pyramid structure of the plurality of second pyramid structures.

In some embodiments, a bottom of a respective platform structure of the plurality of platform structures has a one-dimensional size of 5 μm to 20 μm.

In some embodiments, an orthographic projection of the doped conductive layer on a projection plane is in an orthographic projection of the dielectric layer on the pro-jection plane, the projection plane being a plane perpendicu-lar to a direction directed from the dielectric layer to the doped conductive layer.

In some embodiments, an orthographic projection area of a part, in the non-electrode regions, of the first area on a projection plane is 5% to 30% of an orthographic projection area of the first surface on the projection plane, the projec-tion plane being a plane perpendicular to a direction directed from the dielectric layer to the doped conductive layer.

In some embodiments, the at least one second conductive portion is disposed over only a partial number of the non-electrode regions.

In some embodiments, the first conductive portions are arranged at intervals along the first direction and extend along a second direction intersecting the first direction. The respective second conductive portion is between respective two adjacent first conductive portions of the plurality of first conductive portions and in contact connection with each of the respective two adjacent first conductive portions.

In some embodiments, the at least one second conductive portion is in one-to-one correspondence with the non-elec-trode regions.

In some embodiments, the respective second conductive portion includes a plurality of first strip-shaped structures arranged at intervals along the second direction, and each of the plurality of first strip-shaped structures extends along the first direction and is in contact connection with the respec-tive two adjacent first conductive portions.

In some embodiments, the respective second conductive portion further includes at least one second strip-shaped structure each extending along the second direction.

In some embodiments, the respective second conductive portion includes a plurality of second strip-shaped structures arranged at intervals along the first direction and intersecting the plurality of first strip-shaped structures to form a grid structure.

In some embodiments, a respective first strip-shaped structure of the plurality of first strip-shaped structures has a first width, a respective second strip-shaped structure of the plurality of second strip-shaped structures has a second width, and a respective first conductive portion of the first conductive portions has a third width, where the third width is greater than both the first width and the second width According to some embodiments of the present disclo-sure, another aspect of the embodiments of the present disclosure further provides a tandem solar cell. The tandem solar cell includes a bottom cell and a top cell. The bottom cell is the solar cell in the foregoing embodiments, and the top cell is formed on a side of the doped conductive layer in the bottom cell away from the substrate.

According to some embodiments of the present disclosure, yet another aspect of the embodiments of the present disclosure further provides a photovoltaic module. The photovoltaic module includes at least one cell string, at least one encapsulating film and at least one cover plate. The at least one cell string is each formed by connecting the solar cells as described above or connecting the tandem solar cells as described above. The at least one encapsulating film is each configured to cover a surface of a respective cell string. The at least one cover plate is each configured to cover a surface of a respective encapsulating film facing away from the respective cell string.

BRIEF DESCRIPTION OF THE DRAWINGS

One or more embodiments are exemplarily described with reference to the corresponding figures in the accompanying drawings, and the descriptions are not to be construed as limiting the embodiments. Elements in the accompanying drawings that have same reference numerals are represented as similar elements, and unless otherwise particularly stated, the figures in the accompanying drawings are not drawn to scale. To describe technical solutions of embodiments of the present disclosure more clearly, the following briefly introduces the accompanying drawings required for the embodiments. Apparently, the accompanying drawings in the show only some embodiments of the present disclosure, and a person of ordinary skill in the art may still derive other drawings from these accompanying drawings without creative efforts.

DETAILED DESCRIPTION OF THE EMBODIMENTS

Figure 1:
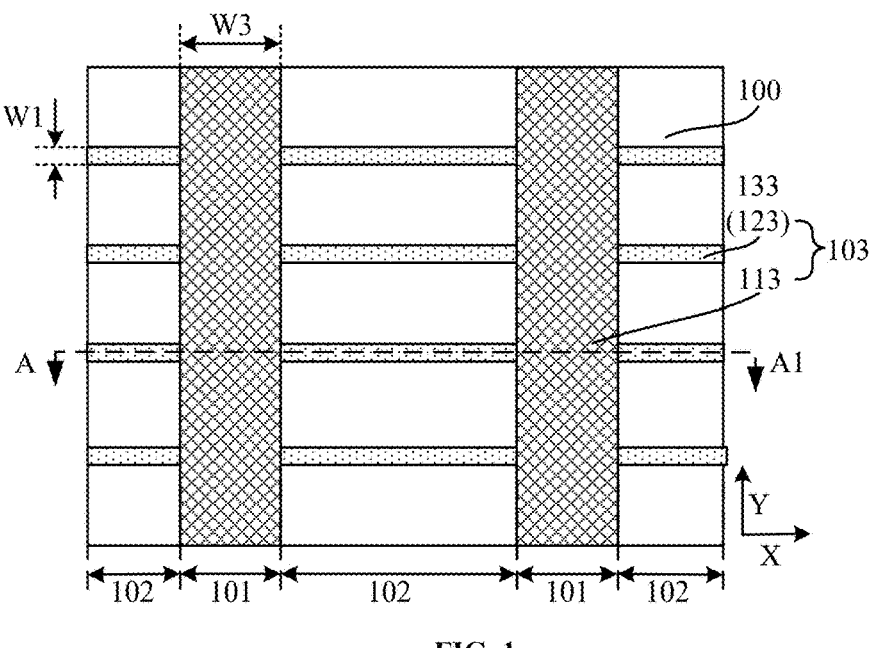
FIG. 1 is a top view of a first partial structure of a solar cell according to an embodiment of the present disclosure.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

In the drawings, the thickness of layers and an area has been enlarged for better understanding and ease of description. When it is described that a part, such as a layer, film, area, or substrate, is "over" or "on" another part, the part may be "directly" on another part or a third part may be present between the two parts. In contrast, when it is described that a part is "directly on" another part, it means that a third part is not present between the two parts. Furthermore, when it is described that a part is "generally" formed on another part, it means the part is not formed on the entire surface (or front surface) of another part and is also not formed in part of the edge of the entire surface.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise.

It can be known from the background that a light absorption rate of a solar cell needs to be improved, and the photoelectric conversion efficiency of the front surface or back surface of the solar cell also needs to be improved.

Analysis showed that most TOPCON cells have a back surface that is entirely of a polished structure. A silicon oxide layer formed over a back surface of a substrate of the cell has a thickness of 1 nm to 2 nm. A main function of a silicon oxide layer is to serve as a tunneling layer for majority carriers, and to chemically passivate the back surface of the substrate to reduce interface state defects on the back surface of the substrate. A main function of a doped polysilicon layer formed over the back surface of the substrate of the cell is to serve as a field passivation layer to form band bending on the back surface of the substrate, so as to selectively transport carriers at the back surface of the substrate and reduce the loss of carrier recombination.

Generally, a doped polysilicon layer with uniform material properties is used to cover the back surface of the entire cell to achieve a good passivation effect on the back surface of the cell and good carrier transmission and collection capabilities. However, the doped polysilicon layer has a high absorption rate for light with a waveband of a 300 nm to 1200 nm, and easily absorbs most of incident light, greatly reducing light incident to the back surface of the cell blocked by the doped polysilicon layer. As a result, the rate absorption of the back surface of the cell for incident light is reduced, causing a large negative impact on photogenerated currents and bifaciality of the cell.

Embodiments of the present disclosure provide a solar cell, a method for preparing the same, a tandem solar cell, and a photovoltaic module. In the solar cell, the first surface is divided into the first part aligned with the doped conductive layer and the second part not aligned with the doped conductive layer, the first part is designed to have the first surface structure including the plurality of first pyramid structures, and the second part is designed to have the second surface structure including the plurality of platform structures. The first part with the plurality of first pyramid structures has a larger surface area than the second part, and the electrode regions in the first part are in electrical contact with electrodes, which is conductive to increasing a contact area between the electrode regions and the first passivation contact structure to reduce a contact resistance between the electrode regions and the first passivation contact structure, thereby improving the efficiency of collecting photogenerated carriers at the first surface by the first passivation contact structure. In addition, the first part with the plurality of first pyramid structures is more uneven than the second part, that is, having a higher surface roughness than the second part, which is conductive to increasing the probability that light incident to the first part at different angles is absorbed by the first part after being reflected by the first pyramid structures, thereby facilitating further improvement of the light absorption rate of the first part and thus improving the overall photoelectric conversion efficiency of the first surface. Moreover, the dielectric layer and the doped conductive layer are formed not only in the electrode regions but also in a part in at least one non-electrode region, so that the dielectric layer and the doped conductive layer have a passivation effect on both the electrode regions and the non-electrode regions, thereby further reducing the loss of carries at the first surface. Moreover, carriers in the non-electrode regions can be collected and transmitted by the dielectric layer and the doped conductive layer, and then provided to the electrode regions, thereby improving the efficiency of collecting photogenerated carriers at the first surface. Further, at least part of each of the non-electrode regions is not blocked by the dielectric layer and the doped conductive layer, so that part of the light can be irradiated to the at least part of each of the non-electrode regions without passing through the doped conductive layer and the dielectric layer, facilitating improvement of the light absorption rate of the non-electrode regions, thereby further improving the photoelectric conversion efficiency of the first surface.

Embodiments of the present disclosure are described in detail below with reference to the accompanying drawings. However, a person of ordinary skill in the art may understand that in each embodiment of the present disclosure, many technical details are provided to enable readers to better understand the embodiments of the present disclosure. However, even without these technical details and various changes and modifications based on the following embodiments, the technical solutions claimed in the embodiments of the present disclosure can be implemented.

An embodiment of the present disclosure provides a solar cell. The solar cell provided in the embodiment of the present disclosure is described in detail below with reference to the accompanying drawings.

Figure 2:
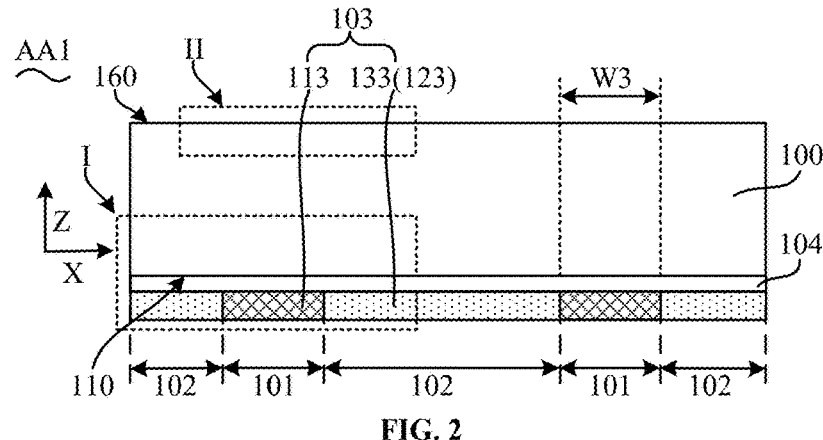
FIG. 2 is a sectional view taken along AA1 of the solar cell in FIG. 1
Figure 3:
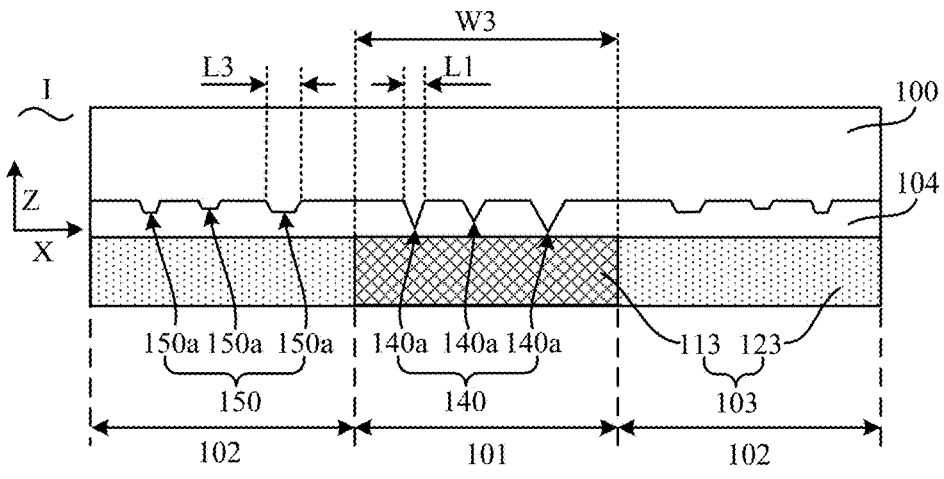
FIG. 3 is a sectional view of an enlarged structure at a box I in FIG. 2.
Figure 4:
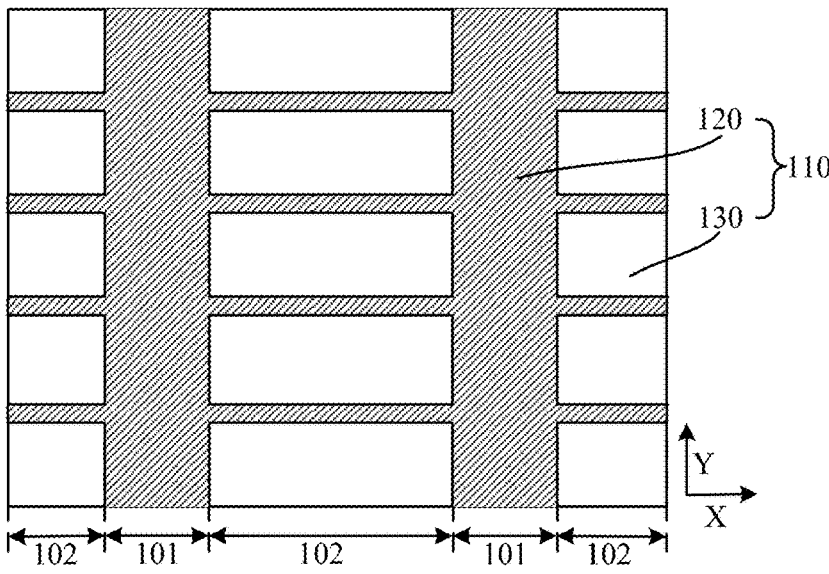
FIG. 4 is a top view of a partial structure of a first surface of a solar cell according to an embodiment of the present disclosure.

With reference to FIG. 1 to FIG. 4, the solar cell includes a substrate 100 having a first surface 110, a doped conductive layer 103 formed over the first surface 110 of the substrate 100, and a dielectric layer 104 between the first surface 110 and the doped conductive layer 103. The first surface 110 includes electrode regions 101 and non-electrode regions 102 that are alternatingly arranged along a first direction X. The doped conductive layer 103 includes first conductive portions 113 and at least one second conductive portion 123. Each first conductive portion 113 of the first conductive portions 113 is formed over a respective electrode region of the electrode regions 101, and each respective second conductive portion 123 of the at least one second conductive portion 123 is formed over a part of a non-electrode region 102 of the non-electrode regions 102. The first surface 110 includes a first part 120 aligned with the doped conductive layer 103 and a second part 130 not aligned with the doped conductive layer 103, the first part 120 has a first surface structure 140 including a plurality of first pyramid structures 140a, and the second part 130 has a second surface structure 150 including a plurality of platform structures 150a. In other words, the first surface 110 includes a first area (i.e., the first part) aligned with the doped conductive layer, and at least one second area (i.e., the second part) that does not overlap with an orthographic projection of any part of the doped conductive layer, where the first area has a first surface structure 140 including a plurality of first pyramid structures 140a; and each of the at least one second area has a second surface 150 structure including a plurality of platform structures. FIG. 1 is a top view of a first partial structure of a solar cell according to an embodiment of the present disclosure. FIG. 2 is a sectional view taken along AA1 of the solar cell in FIG. 1. FIG. 3 is a sectional view of an enlarged structure at a box I in FIG. 2. FIG. 4 is a top view of a partial structure of a first surface of a solar cell according to an embodiment of the present disclosure.

It should be noted that to clearly distinguish between the first part 120 and the second part 130, the first part 120 and the second part 130 are drawn differently in FIG. 4. That is, the first part 120 includes the electrode regions 101 and a part of each respective non-electrode region of at least one of the non-electrode regions 102 that are provided with (or to say, covered by) the doped conductive layer 103 and the dielectric layer 104, and the second part 130 is a remaining part (i.e., a part other than the part of the respective non-electrode region) of the non-electrode regions 102 that is not provided with (or to say, not covered by) the doped conductive layer 103 and the dielectric layer 104.

It is worth noting that a plurality of electrode regions 101 and a plurality of non-electrode regions 102 may be provided. The plurality of electrode regions 101 and the plurality of non-electrode regions 102 are alternatingly arranged along the first direction X. In other words, an electrode region 101 may be located in a spacing between adjacent non-electrode regions 102, and a non-electrode region 102 may be located in a spacing between adjacent electrode regions 101.

It should be noted that the number of electrode regions 101 and the number of non-electrode regions 102 are not limited in embodiments of the present disclosure. FIG. 1, FIG. 2 and FIG. 4 only illustrate two electrode regions 101 and three non-electrode regions 102. In addition, the part of the first surface 110 aligned with the doped conductive layer 103 refers to a part of the first surface 110 that coincides with an orthographic projection of the doped conductive layer 103 on the first surface 110.

In some cases, the doped conductive layer 103 is not formed in all of the non-electrode regions 102, that is, only a partial number of the non-electrode regions 102 are provided with the doped conductive layer 103. In each of the partial number of the non-electrode regions 102 provided with the doped conductive layer 103, only a part is covered by the doped conductive layer 103, and the remaining part not covered by the doped conductive layer 103, which will be described in detail later. Alternatively, in some other cases, a part of each of the non-electrode regions 102 is provided with the doped conductive layer 103. These two kinds of cases will be described in detail below.

It is worth noting that in any of the foregoing two kinds of cases, the dielectric layer 104 and the doped conductive layer 103 sequentially stacked are designed to not only have a part located in the electrode regions 101 to form a first passivation contact structure, but also have another part located in a part of each of at least one non-electrode region 102 to form a second passivation contact structure. Based on this, the electrode regions 101 can be passivated by the first passivation contact structure to reduce the probability of carrier recombination at the electrode regions 101, and the second passivation contact structure facilitates not only reducing the probability of carrier recombination at the non-electrode regions 102, but also collecting and transmitting carriers at the non-electrode regions 102 to the electrode regions 101 to further improve the overall carrier collection efficiency of the first surface 110. i.e., further reducing the overall carrier loss of the first surface 110. The first passivation contact structure and the second passivation contact structure cooperate to improve the overall carrier collection efficiency of the first surface 110, and further reduce the overall carrier loss of the first surface 110.

Moreover, at least part of each of the non-electrode regions 102 is not blocked by the dielectric layer 104 and the doped conductive layer 103, so that part of the light can be irradiated to the at least part of each of the non-electrode regions 102 without passing through the doped conductive layer 103 and the dielectric layer 104, facilitating improvement of the light absorption rate of the non-electrode regions 102, thereby further improving the photoelectric conversion efficiency of the first surface 110.

It should be noted that both the first passivation contact structure located in the electrode regions 101 and the second passivation contact structure located in the non-electrode regions 102 can reduce carrier recombination on the first surface 110. The difference is that the first passivation contact structure and the second passivation contact structure have passivation effects on different regions of the first surface 110. In this way, an open circuit voltage of the solar cell is increased, and the photoelectric conversion efficiency of the solar cell is improved.

It is worth noting that the first surface 110 is divided into the first part 120 aligned with the doped conductive layer 103 and the second part 130 not aligned with the doped conductive layer 103, the first part 120 is designed to have the first surface structure 140 including the plurality of first pyramid structures 140a, and the second part 130 is designed to have the second surface structure 150 including the plurality of platform structures 150a. The first part 120 with the plurality of first pyramid structures 140a has a larger surface area than the second part 130, and the electrode regions 101 in the first part 120 are in electrical contact with electrodes, which is conductive to increasing a contact area between the electrode regions 101 and the first passivation contact structure to reduce a contact resistance between the electrode regions 101 and the first passivation contact structure, thereby improving the efficiency of collecting photo-generated carriers at the first surface 110 by the first passivation contact structure. In addition, the first part 120 with the plurality of first pyramid structures 140a is more uneven than the second part 130, that is, having a higher surface roughness than the second part 130, which is conductive to increasing the probability that light incident to the first part 120 at different angles is absorbed by the first part 120 after being reflected by the first pyramid structures 140a, thereby facilitating further improving the light absorption rate of the first part 120 and improving the overall photoelectric conversion efficiency of the first surface 110.

In addition, compared with a case where the whole first surface 110 has a surface topography including pyramid structures (that is, both the first part 120 and the second part 130 have a surface topography including pyramid structures), the first part 120 is designed to have a surface topography including the plurality of first pyramid structures 140a, and the second part 130 is designed to have a surface topography including the plurality of platform structures 150a, that is, the first part 120 (i.e., both the electrode regions 101 and a part of each of at least one non-electrode region 102) is provided with the doped conductive layer 103 and the dielectric layer 104. In this way, the overall passivation effect of the dielectric layer 104 and the doped conductive layer 103 on the first surface 110 is further improved, and the probability of carrier recombination on the entire first surface 110 is reduced.

In some embodiments, the electrode regions 101 refer to regions of the substrate 100 aligned with electrodes along a thickness direction (i.e., a third direction Z) of the substrate 100, or may be understood as regions where orthographic projections of the electrodes on the substrate 100 are located. In addition, the non-electrode regions 102 refer to regions of the substrate 100 not aligned with the electrodes, or may be understood as regions where orthographic projections of regions other than the electrodes on the substrate 100 are located. In practical application, an orthographic projection area of each electrode region 101 on the substrate 100 may be larger than or equal to an orthographic projection area of a respective electrode on the substrate 100, which is beneficial to ensuring that a contact region between the respective electrode and the substrate 100 is in the electrode region 101. It is worth noting that the electrodes described above are electrodes formed over the first surface 110 of the substrate 100 as described later. In some subsequent embodiments, the electrodes formed over the first surface 110 of the substrate 100 are first electrodes.

Embodiments of the present disclosure are described in detail below with reference to the accompanying drawings.

In some embodiments, with reference to FIG. 2, the substrate 100 further has a second surface 160 opposite to the first surface 110. In some cases, the first surface 110 may be a back surface of the solar cell, and the second surface 160 may be a front surface of the solar cell.

Figure 5:
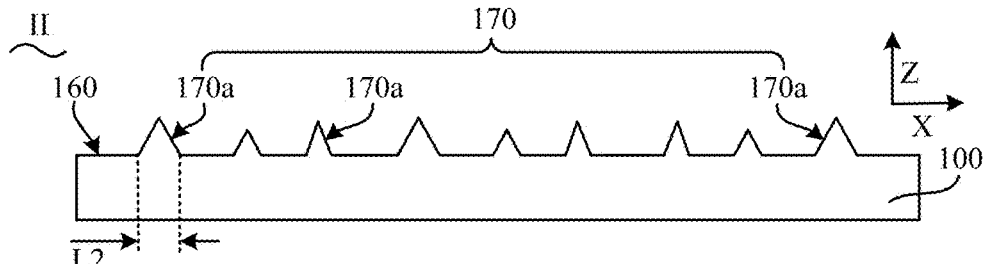
FIG. 5 is a sectional view of an enlarged structure at a box II in FIG. 2.

In some embodiments, with reference to FIG. 1 and FIG. 5 which is a sectional view of an enlarged structure at a box II in FIG. 2, the substrate 100 further has a second surface 160 opposite to the first surface 110. The second surface 160 has a third surface structure 170. The third surface structure 170 includes a plurality of second pyramid structures 170a.

It is worth noting that the second pyramid structures 170a facilitate increasing the probability that light incident to the second surface 160 at different angles is absorbed by the second surface 160 after being reflected by the second pyramid structure 170a, thereby being conducive to further improving the light absorption rate of the second surface 160 and improving the overall photoelectric conversion efficiency of the second surface 160.

In some embodiments, with reference to FIG. 3 and FIG. 5, a one-dimensional size L1 of a bottom of a respective first pyramid structure 140a is smaller than a one-dimensional size L2 of a bottom of a respective second pyramid structure 170a.

It is worth noting that a part of the first surface 110 has the surface topography including the first pyramid structures 140a. On one hand, the light absorption rate of the first surface 110 is improved by means of the first pyramid structures 140a. On the other hand, it is necessary to consider the influence of the first pyramid structures 140a on the passivation effect, on the first surface 110, of the dielectric layer 104 and the doped conductive layer 103 located on the first surface 110. Based on this, the one-dimensional size L1 of the bottom of the respective first pyramid structure 140a is designed to be smaller than the one-dimensional size L2 of the bottom of the respective second pyramid structure 170a, which is beneficial to ensuring a good passivation effect of the dielectric layer 104 and the doped conductive layer 103 on the first surface 110 while ensuring a relatively high light absorption rate of the first surface 110.

In some embodiments, the one-dimensional size L1 of the bottom of the first pyramid structure 140a may be 0.5 μm to 5 μm, for example, 1 μm, 1.5 μm, 2 μm, 2.5 μm, 3 μm, 3.5 μm, 4 μm, or 4.5 μm. Along the third direction Z, the maximum value of the height of the first pyramid structure 140a is 0.5 μm to 3 μm, for example, 1 μm, 1.5 μm, 2 μm, or 2.5 μm.

In some embodiments, the one-dimensional size L2 of the bottom of the respective second pyramid structure 170a may be 2 μm to 5 μm, for example, 2.5 μm, 3 μm, 3.5 μm, 4 μm, or 4.5 μm. Along the third direction Z, a maximum height of the second pyramid structure 170a is 1 μm to 3 μm, for example, 1.5 μm, 2 μm, or 2.5 μm.

Figure 6:
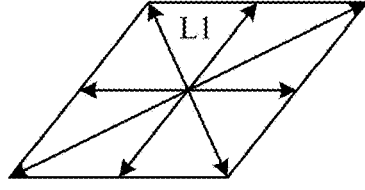
FIG. 6 is a top view of a structure of a bottom of a first pyramid structure in a solar cell according to an embodiment of the present disclosure.

It should be noted that, with reference to FIG. 6, FIG. 6 is a top view of a structure of a bottom of a first pyramid structure in a solar cell according to an embodiment of the present disclosure. The one-dimensional size L1 of the bottom of the first pyramid structure 140a includes any of a length, a width, or a diagonal length of an orthographic projection pattern of the bottom of the first pyramid structure 140a on the substrate 100. In addition, an example in which an orthographic projection pattern of the bottom of the first pyramid structure 140a on the substrate 100 is a regular quadrilateral is illustrated in FIG. 6. In this case, the one-dimensional size L1 of the bottom of the first pyramid structure 140a is any one of a length, a width, or a diagonal length of the regular quadrilateral.

Figure 7:
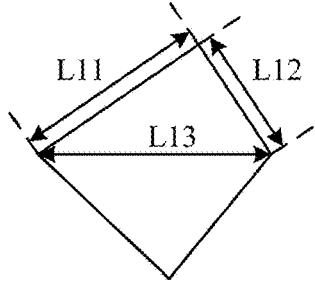
FIG. 7 is a top view of another structure of a bottom of a first pyramid structure in a solar cell according to an embodiment of the present disclosure.

In practical application, the orthographic projection pattern of the bottom of the first pyramid structure 140a on the substrate 100 may alternatively be an irregular polygon. In this case, the length, the width, or the diagonal length of the orthographic projection pattern of the bottom of the first pyramid structure 140a on the substrate 100 is not absolute, but is artificially defined to represent the one-dimensional size L1 of the bottom of the first pyramid structure 140a. For example, with reference to FIG. 7 which is a top view of another structure of a bottom of a first pyramid structure in a solar cell according to an embodiment of the present disclosure, the orthographic projection pattern of the bottom of the first pyramid structure 140a on the substrate 100 is an irregular quadrilateral. In this case, a length L11 of the orthographic projection pattern of the bottom of the first pyramid structure 140a on the substrate 100 may be defined as a length of the longest side of the irregular quadrilateral. A width L12 of the orthographic projection pattern of the bottom of the first pyramid structure 140a on the substrate 100 may be defined as a length of the shortest side of the irregular quadrilateral. A diagonal length L13 of the orthographic projection pattern of the bottom of the first pyramid structure 140a on the substrate 100 may be defined as a length of the longest diagonal line of the irregular quadrilateral. It may be understood that the above is only an exemplary description and may be flexibly defined in practice according to actual needs.

In addition, in addition to an irregular quadrilateral, the orthographic projection pattern of the bottom of the first pyramid structure 140a on substrate 100 may alternatively be another irregular polygon, a circle, or an irregular shape approximating a circle. In this case, the one-dimensional size L1 of the bottom of the first pyramid structure 140a is an average value of lengths, widths, diagonal lengths or diameters of a plurality of regions of different specific areas selected from the bottom of the first pyramid structure 140a, where the specific areas may be flexibly defined according to the actual requirements.

It should be noted that the definition of the one-dimensional size L2 of the bottom of the second pyramid structure 170a is similar to that of the one-dimensional size L1 of the bottom of the first pyramid structure 140a. Details are not described herein again. In addition, one-dimensional sizes L1 of bottoms of different first pyramid structures 140a may be different or the same, but are within a numerical range. One-dimensional sizes L2 of bottoms of different second pyramid structures 170a may be different or the same, but are within a numerical range.

In some embodiments, with reference to FIG. 3, a one-dimensional size L3 of a bottom of a respective platform structure 150a is 5 μm to 20 μm, for example, 6 μm, 7 μm, 8 μm, 9 μm, 10 μm, 11 μm, 12 μm, 13 μm, 14 μm, 15 μm, 16 μm, 17μ, 18 μm, or 19 μm.

It should be noted that the definition of the one-dimensional size L3 of the bottom of the platform structure 150a is also similar to that of the one-dimensional size L1 of the bottom of the first pyramid structure 140a. Details are not described herein again. In addition, one-dimensional sizes L3 of bottoms of different platform structures 150a may be different or the same, but are within a numerical range.

In some embodiments, with reference to FIG. 1 and FIG. 2, a direction directed from the dielectric layer 104 to the doped conductive layer 103 is a third direction Z. A plane perpendicular to the third direction Z is a projection plane. An orthographic projection of the doped conductive layer 103 on the projection plane is located on an orthographic projection of the dielectric layer 104 on the projection plane.

It should be noted that a part of the first surface 110 aligned with the doped conductive layer 103 (i.e., the first part 120) includes not only the electrode regions 101 but also a part, provided with the doped conductive layer 103, in the non-electrode regions 102; and a part of the first surface 110 not aligned with the doped conductive layer 103 (i.e., the second part 130) includes only the other part in the non-electrode regions 102.

In addition, the dielectric layer 104 is provided between the doped conductive layer 103 and the first surface 110 in both the electrode regions 101 and the part in the respective non-electrode regions 102 provided with the doped conductive layer 103, that is, the dielectric layer 104 is provided between the first part 120 and the doped conductive layer 103, to ensure that any part of the first surface 110 aligned with the doped conductive layer 103 is provided with the dielectric layer 104 corresponding to the doped conductive layer 103, so as to form a passivation contact structure. It is worth noting that a thickness direction of the substrate 100 is a direction directed from the dielectric layer 104 to the doped conductive layer 103.

In some embodiments, with reference to FIG. 1 and FIG. 4, a direction directed from the dielectric layer 104 to the doped conductive layer 103 is a third direction Z. A plane perpendicular to the third direction Z is a projection plane.

An orthographic projection area of a part, in the non-electrode regions 102, of the first part 120 on the projection plane is a first area. An orthographic projection area of the first surface 110 on the projection plane is a second area. The first area is 5% to 30% of the second area.

If the first area is less than 5% of the second area, an area of a part in the non-electrode regions 102 covered by the doped conductive layer 103 is excessively small, which is not conducive to effective collection of photogenerated carriers in the non-electrode regions 102 by the doped conductive layer 103. If the first area is greater than 30% of the second area, an area of the part in the non-electrode regions 102 covered by the doped conductive layer 103 is excessively large, which is not conducive to irradiation of incident light to more part of the non-electrode regions 102, and therefore is not conducive to absorption of light by the non-electrode regions 102. Therefore, the first area is designed to be 5% to 30% of the second area, which is conducive to ensuring that the doped conductive layer 103 has high efficiency of collecting photogenerated carriers in the non-electrode regions 102, while most part in the non-electrode regions 102 are not covered by the doped conductive layer 103 to ensure a high light absorption rate in the non-electrode regions 102.

Figure 8:
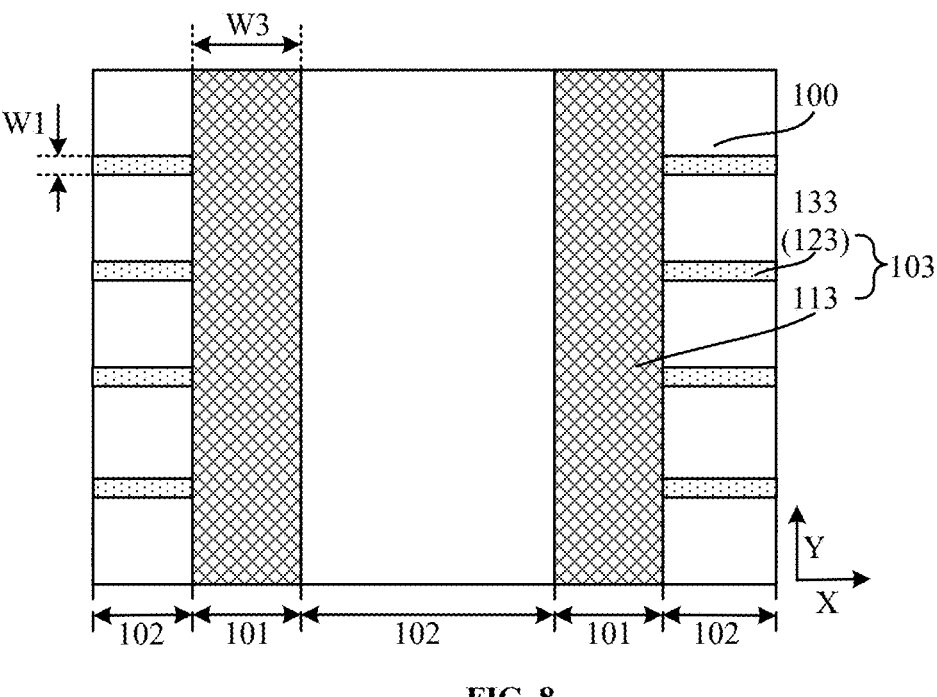
FIG. 8 is a top view of a second partial structure of a solar cell according to an embodiment of the present disclosure.

In some embodiments, with reference to FIG. 8 which is a top view of a second partial structure of a solar cell according to an embodiment of the present disclosure, in the non-electrode regions 102, the doped conductive layer 103 is formed in only some of the non-electrode regions 102. That is, the at least one second conductive portion 123 is disposed over only a partial number of the non-electrode regions 102.

It should be noted that FIG. 8 only illustrates that two non-electrode regions 102 are provided with the doped conductive layer 103, and one non-electrode region 102 is not provided with the doped conductive layer 103. A number of non-electrode regions 102 provided with the doped conductive layer 103 and a number of non-electrode regions 102 not provided with the doped conductive layer 103 are not limited in embodiments of the present disclosure, which may be flexibly adjusted according to specific needs in practical application. In addition, FIG. 8 shows only an example of an arrangement manner of non-electrode regions 102 provided with the doped conductive layer 103 and non-electrode regions 102 not provided with the doped conductive layer 103. The arrangement manner of the non-electrode regions 102 provided with the doped conductive layer 103 and the non-electrode regions 102 not provided with the doped conductive layer 103 is not limited in an embodiment of the present disclosure, which may also be flexibly adjusted according to specific needs in practical application.

Figure 9:
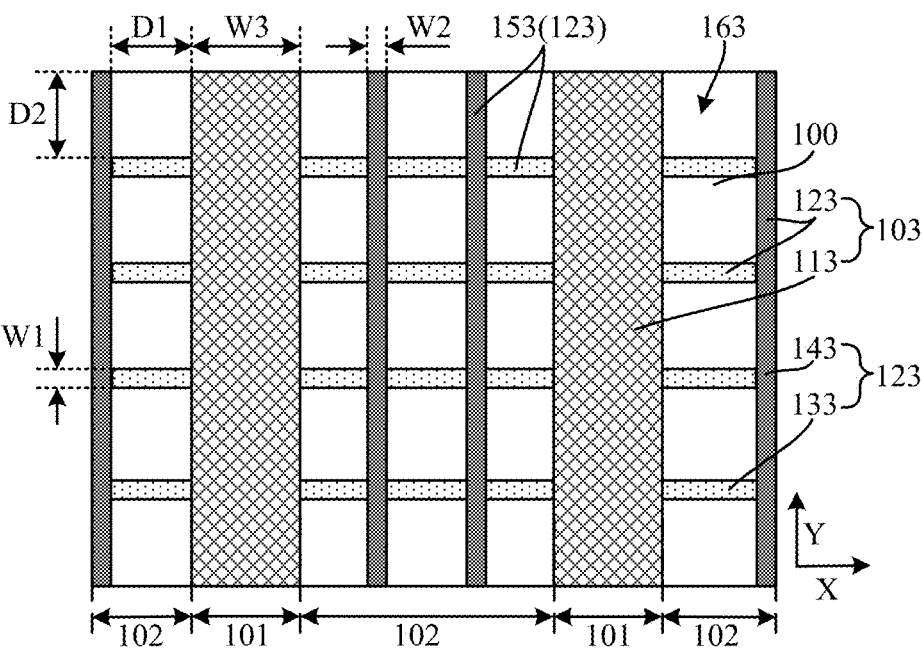
FIG. 9 is a top view of a third partial structure of a solar cell according to an embodiment of the present disclosure.

In some embodiments, with reference to FIG. 1, FIG. 8, or FIG. 9 which is a top view of a third partial structure of a solar cell according to an embodiment of the present disclosure, the doped conductive layer 103 may include: a plurality of first conductive portions 113 arranged at intervals along the first direction X and formed in the electrode regions 101 in one-to-one correspondence, where each first conductive portion 113 extends along a second direction Y, and the first direction X intersects the second direction Y; and at least one second conductive portion 123, where each respective second conductive portion 123 is formed in the respective non-electrode region 102, and each second conductive portion 123 is between respective two adjacent first conductive portions 113 and in contact connection with the respective two adjacent first conductive portions 113.

It should be noted that, a part (regardless of internally having contact connection or spaced arrangement) of the doped conductive layer 103 located in one non-electrode region 102 is regarded as one second conductive portion 123. The specific configuration of one second conductive portion 123 located in one non-electrode region 102 will be described in detail later.

In other words, one second conductive portion 123 may be disposed in a spacing between two first conductive portions 113 adjacent to each other along the first direction X, and is in contact connection with the two adjacent first conductive portions 113. In this way, photogenerated carriers in the non-electrode region 102 can be collected first by the second conductive portion 123, then transported to the first conductive portions 113 via the second conductive portion 123 in contact connection with the first conductive portions 113, and finally transported to the electrodes through the first conductive portions 113, thereby facilitating improving, by means of the second conductive portion 123, the efficiency of collecting photogenerated carriers at the first surface 110 by the electrodes.

It is worth noting that in some cases, with reference to FIG. 8, not every non-electrode region 102 is provided with a second conductive portion 123, and a second conductive portion 123 is not provided in a spacing between any two adjacent first conductive portions 113. In practical application, a non-electrode region 102 that needs to be provided with a second conductive portion 123, as well as a number of second conductive portions 123 in the non-electrode regions 102, may be flexibly selected according to specific needs.

In some embodiments, with reference to FIG. 8, one second conductive portion 123 is located in one non-electrode region 102, but not each of the non-electrode regions 102 is provided with a second conductive portion 123.

In other some embodiments, with reference to FIG. 9, the second conductive portions 123 are in one-to-one correspondence with the non-electrode regions 102. In other words, each non-electrode region 102 is provided with a second conductive portion 123. In this way, each non-electrode region 102 is provided with the dielectric layer 104 and the second conductive portion 123 that can passivate the non-electrode region 102, to reduce a probability of carrier recombination in the non-electrode region 102, and photogenerated carriers in the non-electrode region 102 can be collected by the corresponding second conductive portion 123 and then transported to a closest first conductive portion 113.

In some embodiments, with reference to FIG. 1, FIG. 8 and FIG. 9, the second conductive portion 123 may include a plurality of first strip-shaped structures 133 arranged at intervals along the second direction Y. Each first strip-shaped structure 133 extends along the first direction X and is in contact connection with first conductive portions 113 adjacent to the first strip-shaped structure 133.

In this way, two ends of each first strip-shaped structure 133 in the first direction X are in contact connection with two first conductive portions 113 adjacent to the first strip-shaped structure 133 respectively, so that photogenerated carriers in a part of the non-electrode region 102 can be transported to the first conductive portion 113 along the first direction X by means of the first strip-shaped structure 133, thereby ultimately improving the efficiency of collecting photogenerated carriers at the first surface 110 by the electrodes.

In some cases, with reference to FIG. 1 or FIG. 8, the second conductive portion 123 may include only a plurality of first strip-shaped structures 133 arranged at intervals along the second direction Y. Each first strip-shaped structure 133 extends along the first direction X and is in contact connection with first conductive portions 113 adjacent to the first strip-shaped structure 133. In some examples, with reference to FIG. 8, only a partial number of the non-electrode regions 102 may be each provided with a first strip-shaped structure 133. In other words, only a partial number of the non-electrode regions 102 may be provided with the doped conductive layer 103. In some other examples, with reference to FIG. 1, each non-electrode region 102 is provided with one first strip-shaped structure 133. In other words, the second conductive portions 123 are in one-to-one correspondence with the non-electrode regions 102.

It is worth noting that with reference to FIG. 1 or FIG. 8, the second conductive portion 123 includes only a plurality of first strip-shaped structures 133 arranged at intervals along the second direction Y. That is, the first strip-shaped structures 133 is the second conductive portion 123.

It should be noted that FIG. 1 and FIG. 8 only illustrate that a second conductive portion 123 located in a non-electrode region 102 includes four first strip-shaped structures 133. In an embodiment of the present disclosure, a number of the first strip-shaped structures 133 included in any one of the second conductive portions 123 is not limited. For example, the number of the first strip-shaped structures 133 included in the second conductive portion 123 may be 1, 2, 3, 5, or the like. In addition, only an example in which there are a same number of first strip-shaped structures 133 included in different second conductive portions 123 located in different non-electrode regions 102 is illustrated in FIG. 1 and FIG. 8. In practical application, the number of first strip-shaped structures 133 included in different second conductive portions 123 located in different non-electrode regions 102 may alternatively be different and may be adjusted according to specific needs.

In some examples, in the case where the second conductive portion 123 includes only a plurality of first strip-shaped structures 133 arranged at intervals along the second direction Y, a spacing in the second direction Y between adjacent first strip-shaped structures 133 may be 5 μm to 200 μm.

It is worth noting that the spacing between the adjacent first strip-shaped structures 133 affects the density of the arrangement of the plurality of first strip-shaped structures 133. In practical application, the spacing between the adjacent first strip-shaped structures 133 may be flexibly adjusted according to the requirement on the density of the arrangement of the first strip-shaped structures 133. In addition, a spacing between any two adjacent first strip-shaped structures 133 may be the same or different. For example, three first strip-shaped structures 133 that are adjacent along the second direction Y have two spacings in the second direction Y, and the two spacings may be the same or different.

Figure 10:
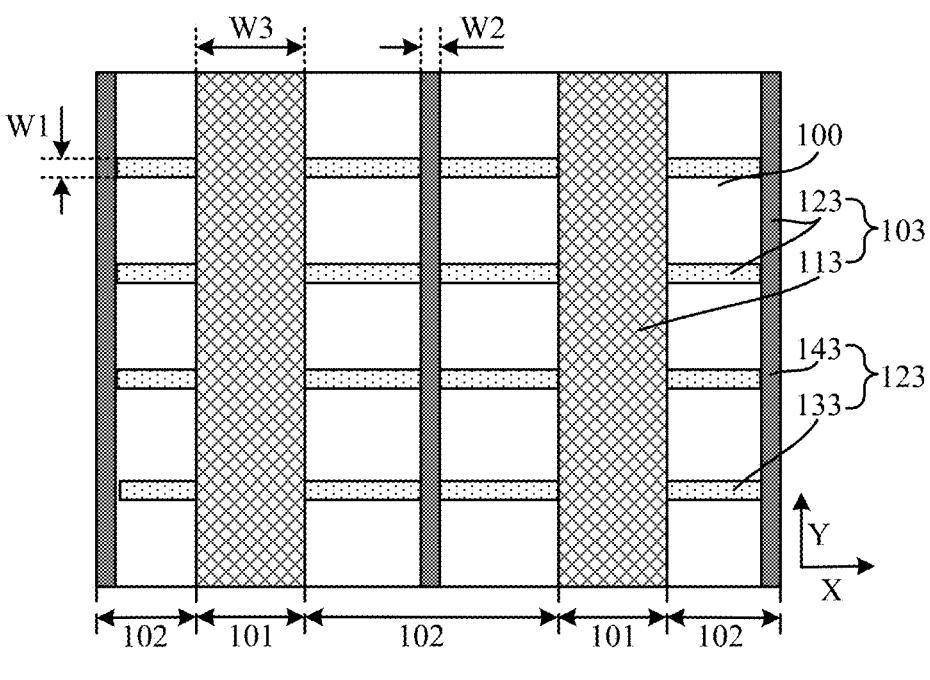
FIG. 10 is a top view of a fourth partial structure of a solar cell according to an embodiment of the present disclosure.

In some other cases, with reference to FIG. 9 or FIG. 10 (FIG. 10 is a top view of a fourth partial structure of a solar cell according to an embodiment of the present disclosure), in the case where the second conductive portion 123 includes a plurality of first strip-shaped structures 133 arranged at intervals along the second direction Y, the second conductive portion 123 may further include at least one second strip-shaped structure 143 extending along the second direction Y.

It is worth noting that with reference to FIG. 9 or FIG. 10, a plurality of first strip-shaped structures 133 and at least one second strip-shaped structure 143 located in the same non-electrode region 102 together form one second conductive portion 123.

In some examples, with reference to FIG. 10, in the case where the second conductive portion 123 includes a plurality of first strip-shaped structures 133 arranged at intervals along the second direction Y, the second conductive portion 123 may further include only one second strip-shaped structure 143 extending along the second direction Y.

In this way, in the case where two ends of each first strip-shaped structure 133 in the first direction X are in contact connection with two adjacent first conductive portions 113 respectively, the second strip-shaped structure 143 may collect photogenerated carriers in the non-electrode regions 102 in the second direction Y, so that photogenerated carriers in part of the non-electrode region 102 can be transported to the first conductive portions 113 along the first direction X by means of the first strip-shaped structures 133. In addition, the first strip-shaped structures 133 may collect carriers in the second strip-shaped structure 143 to transport the carriers in the first direction X to the first conductive portions 113, thereby ultimately improving the efficiency of collecting photogenerated carriers of the first surface 110 by the electrodes.

In some other examples, with reference to FIG. 9, in the case where the second conductive portion 123 includes a plurality of first strip-shaped structures 133 arranged at intervals along the second direction Y, the second conductive portion 123 may include a plurality of second strip-shaped structures 143 arranged at intervals along the first direction X, the plurality of second strip-shaped structures 143 intersect with the plurality of first strip-shaped structures 133 to form a grid structure 153. It should be noted that a number of the plurality of second strip-shaped structures 143 arranged at intervals along the first direction X is greater than or equal to 2.

It is worth noting that along the second direction Y, the plurality of first strip-shaped structures 133 may respectively collect photogenerated carriers in different regions of the non-electrode region 102. Based on this, the plurality of second strip-shaped structures 133 is designed to intersect the plurality of first strip-shaped structures 143 to form the grid structure 153, which can provide a plurality of transportation paths to allow the photogenerated carriers in the non-electrode region 102 to be transported to the first conductive portions 113. In addition, the plurality of second strip-shaped structures 143 can also respectively collect photogenerated carriers in different regions of the non-electrode region 102. In this way, the efficiency of collecting photogenerated carriers in the entire non-electrode region 102 is further improved by means of the grid structure 153 to further improve the efficiency of collecting photogenerated carriers at the first surface 110 by the doped conductive layer 103, which is conducive to ultimately improving the efficiency of collecting photogenerated carriers of the first surface 110 by the electrodes.

It should be noted that FIG. 9 only illustrates that the second conductive portion 123 located in a non-electrode region 102 includes two second strip-shaped structures 143. In an embodiment of the present disclosure, a number of the second strip-shaped structures 143 included in any one of the second conductive portions 123 is not limited. For example, the number of second strip-shaped structures 143 included in the second conductive portion 123 may be 3, 4, 5, or the like. Furthermore, the number of second strip-shaped structures 143 included in different second conductive portions 123 located in different non-electrode regions 102 may be the same or different and adjusted according to specific needs.

With reference to FIG. 9 or FIG. 10, in an embodiment in which first conductive portions 113, first strip-shaped structures 133, and second strip-shaped structures 143 are provided, along the second direction Y, the first strip-shaped structure 133 has a first width W1; along the first direction X, the second strip-shaped structure 143 has a second width W2; and along the first direction X, the first conductive portion 113 has a third width W3. The third width W3 is greater than the first width W1, and the third width W3 is greater than the second width W2.

It is worth noting that the first strip-shaped structure 133 and the second strip-shaped structure 143 are mainly used to collect photogenerated carriers in different regions of the non-electrode region 102, and the first strip-shaped structure 133 and the second strip-shaped structure 143 should not cover an excessively large part of the non-electrode region 102 to avoid that more light cannot be absorbed due to the fact that the excessively large part of the non-electrode regions 102 is sheltered. Therefore, it is not appropriate to design the first width W1 of the first strip-shaped structure 133 and the second width W2 of the second strip-shaped structure 143 to be excessively large. In contrast, the first conductive portion 113 not only needs to further collect the photogenerated carriers collected in the first strip-shaped structure 133 and the second strip-shaped structure 143, but also needs to be in contact with the electrode to finally transport the photogenerated carriers to the electrode. Therefore, the first conductive portion 113 need to be designed to have a strong collection capability of photogenerated carriers, and have a small contact resistance with the electrode.

Based on this, the third width W3 is designed to be greater than both the first width W1 and the second width W2, so that a volume of the first conductive portion 113 is larger than a volume of each of the first strip-shaped structure 133 and the second strip-shaped structure 143. In this way, it is conducive to ensure that the non-electrode region 102 can receive more incident light to enable a relatively high light absorption rate in the non-electrode region 102, while the first strip-shaped structure 133 and the second strip-shaped structure 143 can collect photogenerated carriers in different regions of the non-electrode region 102. In addition, it is conducive to improving the efficiency of collecting photogenerated carriers in the first strip-shaped structure 133 and the second strip-shaped structure 143 by the first conductive portion 113, and improving a contact area between the first conductive portion 113 and the electrode, to reduce a contact resistance between the first conductive portion 113 and the electrode. Therefore, the two work together to facilitate improving the light absorption rate of the first surface 110, and improving the passivation effect of the passivation contact structure formed by the doped conductive layer 103 and the dielectric layer 104 on the first surface 110 to improve the efficiency of collecting photogenerated carriers at the first surface 110 by the electrodes, so that the overall photoelectric conversion efficiency of the first surface 110 and the bifaciality of the solar cell can be improved.

It should be noted that FIG. 1, FIG. 8 and FIG. 10 illustrate an example in which first widths W1 of different first strip-shaped structures 133 are the same. In practical application, the first widths W1 of different first strip-shaped structures 133 may be different and may be adjusted according to specific needs. FIG. 9 or FIG. 10 illustrates an example in which second widths W2 of different second strip-shaped structures 143 are the same. In practical application, the second widths W2 of different second strip-shaped structures 143 may be different and may be adjusted according to specific needs. FIG. 1 to FIG. 3, FIG. 8 and FIG. 10 illustrate an example in which third widths W3 of different first conductive portions 113 are the same. In practical application, the third widths W3 of different first conductive portions 113 may be different and may be adjusted according to specific needs.

With reference to FIG. 1, FIG. 8 and FIG. 10, in an embodiment in which first strip-shaped structures 133 are provided, along the second direction Y, the first strip-shaped structure 133 has a first width W1, and the first width W1 may be 5 μm to 100 μm, for example, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, or 105 μm.

If the first width W1 is less than 5 μm, it is not conductive to effective collection of photogenerated carriers in the non-electrode regions 102 by the first strip-shaped structure 133. If the first width W1 is greater than 100 μm, the first strip-shaped structure 133 covers an excessively large part of the non-electrode region 102, which is not conducive to irradiation of incident light to the non-electrode region 102, and thus is not conducive to the absorption of light by the non-electrode region 102. Based on this, designing the first width W1 to be 5 μm to 100 μm is conducive to ensuring that the first strip-shaped structure 133 has high efficiency of collecting photogenerated carriers in the non-electrode region 102, while most part of the non-electrode region 102 is not covered by the first strip-shaped structure 133 to ensure a high light absorption rate of the non-electrode regions 102.

With reference to FIG. 9 or FIG. 10, in the embodiment in which second strip-shaped structures 143 are provided, along the first direction X, the second strip-shaped structure 143 has a second width W2, and the second width W2 may be 5 μm to 100 μm, for example, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, or 105 μm.

It should be noted that the technical effect achieved by designing the second width W2 to be 5 μm to 100 μm is similar to the technical effect achieved by designing the first width W1 to be 5 μm to 100 μm. Details are not described herein again.

With reference to FIG. 1 to FIG. 3, FIG. 8 and FIG. 10, in an embodiment in which first conductive portions 113 are provided, along the first direction X, the first conductive portion 113 has a third width W3, and the third width W3 may be 50 μm to 500 μm, for example, 60 μm, 80 μm, 100 μm, 150 μm, 200 μm, 250 μm, 300 μm, 350 μm, 400 μm, or 450 μm.

If the third width W3 is less than 50 μm, a contact area between the first conductive portion 113 and the electrode is small, resulting in a large contact resistance between the first conductive portion and the electrode and a large loss generated when photogenerated carriers are transported from the first conductive portion 113 to the electrode, which is also conductive to collection of photogenerated carriers in the second conductive portion 123 by the first conductive portion 113. If the third width W3 is greater than 500 μm, the first conductive portions 113 cover an excessively large part of the first surface 110, in other words, a proportion of the electrode regions 101 in the first surface 110 is excessively large, which is not conducive to irradiation of incident light to the first surface 110, and therefore is not conducive to the absorption of light by the first surface 110. Based on this, designing the third width W3 to be 50 μm to 500 μm is conducive to improving a contact area between the first conductive portion 113 and the electrode to reduce a contact resistance between the first conductive portions 113 and the electrode, while ensuring that the first conductive portion 113 has high efficiency of collecting photogenerated carriers in the second conductive portion 123. In addition, the non-electrode regions 102 occupy a large proportion in the first surface 110 to ensure that the first surface 110 as a whole has a high light absorption rate.

In some embodiments, with reference to FIG. 9, the grid structure 153 has a plurality of mesh holes 163 defined by the first strip-shaped structures 133 and the second strip-shaped structures 143. A first size D1 of a single mesh hole 163 in the first direction X is less than or equal to 100 μm. A second size D2 of the single mesh hole 163 in the second direction Y may be 5 μm to 200 μm.

It is worth noting that the mesh holes 163 are regions in the first surface 110 that are mainly used to absorb light. An exposed non-electrode region 102 is divided into a plurality of mesh holes 163 by the first strip-shaped structures 133 and the second strip-shaped structures 143, the first size D1 of a single mesh hole 163 is less than or equal to 100 μm, and the second size D2 of the single mesh hole D2 is 5 μm to 200 μm, which is conducive to targeted collection of photogenerated carriers at each mesh hole 163 by the first strip-shaped structure 133 and/or the second strip-shaped structure 143 that are closer to the photogenerated carriers, so that the second conductive portion 123 can collect the photogenerated carriers at any mesh hole 163 targetedly to improve the efficiency of collecting photogenerated carriers at the first surface 110 by the electrodes.

It is worth noting that peripheries of some of the mesh holes 163 are surrounded by the first strip-shaped structures 133 and the second strip-shaped structure 143, and peripheries of the other of the mesh holes 163 are surrounded by the first strip-shaped structures 133, the second strip-shaped structures 143, and the first conductive portions 113. Furthermore, first sizes D1 of different mesh holes 163 arranged along the first direction X may be the same or different, and second sizes D2 of different mesh holes 163 arranged along the second direction Y may be the same or different, which can be adjusted according to actual needs.

In some embodiments, along the third direction Z, a thickness of the doped conductive layer 103 may be 50 nm to 200 nm.

Figure 11:
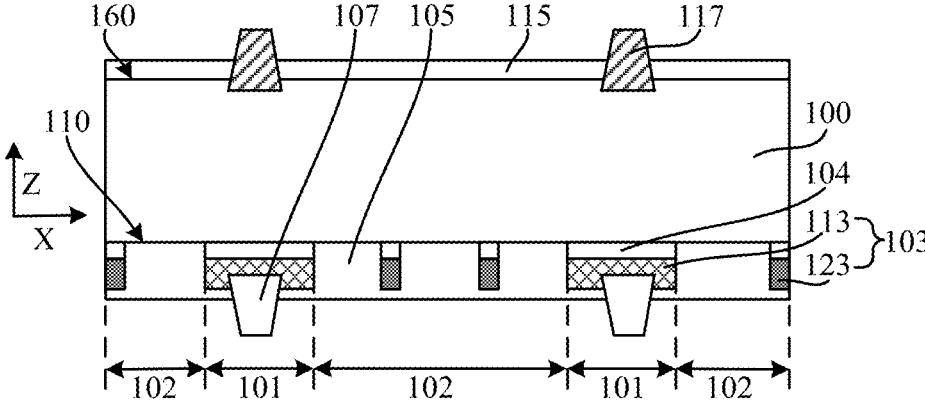
FIG. 11 is a sectional view of another partial structure of a solar cell according to an embodiment of the present disclosure.

In some embodiments, with reference to FIG. 11 which is a sectional view of another partial structure of a solar cell according to an embodiment of the present disclosure, the solar cell may further include first electrodes 107. Each first electrode 107 is electrically connected to the doped conductive layer 103.

In some embodiments, with reference to FIG. 11, the solar cell may further include a first passivation layer 105 formed over the first surface 110 where the dielectric layer 104 and the doped conductive layer 103 are formed. The first electrodes 107 penetrate the first passivation layer 105 to be in electrical contact with the doped conductive layer 103.

In some embodiments, the first passivation layer 105 may be of a single-layer structure or a stacked layer structure, and a material of the first passivation layer 105 may be at least one of silicon oxide, silicon nitride, silicon oxynitride, silicon oxynitride, titanium oxide, hafnium oxide, aluminum oxide, and the like.

In some examples, with reference to FIG. 11, the first passivation layer 105 includes a first sub-passivation layer and a second sub-passivation layer that are sequentially stacked along the third direction Z. A material of the first sub-passivation layer may be aluminum oxide. A material of the second sub-passivation layer may be at least one of silicon oxide, silicon nitride, and a silicon oxynitride material.

In some embodiments, a thickness of the first sub-passivation layer in the third direction Z may be 5 nm to 10 nm.

In some embodiments, with continued reference to FIG. 11, the substrate 100 further has a second surface 160 opposite to the first surface 110. The solar cell may further include second electrodes 117 electrically connected to the second surface 160.

In some embodiments, with continued reference to FIG. 11, the solar cell may further include a second passivation layer 115 formed over the second surface 160. The second electrodes 117 penetrate the second passivation layer 115 to be in electrical contact with the second surface 160.

It should be noted that a film layer structure and material composition of the second passivation layer 115 are similar to those of the first passivation layer 105. Details are not described herein again.

In addition, in FIG. 1 to FIG. 3 and FIG. 8 to FIG. 10, the first conductive portion 113 and the second conductive portion 123 are drawn in different filling manners to distinguish the first conductive portion 113 and the second conductive portion 123. In practical application, the first conductive portion 113 and the second conductive portion 123 may be formed simultaneously. In FIG. 9, FIG. 10, and FIG. 11, the first strip-shaped structure 133 and the second strip-shaped structure 143 are drawn in different filling manners to distinguish the first strip-shaped structure 133 and the second strip-shaped structure 143. In practical application, the first strip-shaped structure 133 and the second strip-shaped structure 143 both belong to the second conductive portion 123. That is, the first strip-shaped structure 133 and the second strip-shaped structure 143 may also be formed simultaneously.

In conclusion, the first surface 110 is divided into the first part 120 aligned with the doped conductive layer 103 and the second part 130 not aligned with the doped conductive layer 103, the first part 120 is designed to have the first surface structure 140 including the plurality of first pyramid structures 140a, and the second part 130 is designed to have the second surface structure 150 including the plurality of platform structures 150a. The first part 120 with the plurality of first pyramid structures 140a has a larger surface area than the second part 130, and the electrode regions 101 in the first part 120 are in electrical contact with electrodes, which is conductive to increasing a contact area between the electrode regions 101 and the first passivation contact structure to reduce a contact resistance between the electrode regions 101 and the first passivation contact structure, thereby improving the efficiency of collecting photogenerated carriers at the first surface 110 by the first passivation contact structure. In addition, the first part 120 with the plurality of first pyramid structures 140a is more uneven than the second part 130, that is, having a higher surface roughness than the second part 130, which is conductive to increasing the probability that light incident to the first part 120 at different angles is absorbed by the first part 120 after being reflected by the first pyramid structures 140a, thereby facilitating further improving the light absorption rate of the first part 120 and improving the overall photoelectric conversion efficiency of the first surface 110. Moreover, the dielectric layer 104 and the doped conductive layer 103 are formed not only in the electrode regions but also in a part of each of at least one non-electrode region, so that the dielectric layer 104 and the doped conductive layer 103 have a passivation effect on the electrode regions 101 and the non-electrode regions 102, thereby reducing carrier recombination at the first surface 110. Further, at least part of each of the non-electrode regions 102 is not blocked by the dielectric layer 104 and the doped conductive layer 103, so that part of the light can be irradiated to the at least part of each of the non-electrode regions 102 without passing through the doped conductive layer 103 and the dielectric layer 104, facilitating improvement of the light absorption rate of the non-electrode regions 102, thereby further improving the photoelectric conversion efficiency of the first surface 110. In this way, under the comprehensive function of the above, the overall photoelectric conversion efficiency of the first surface 110 can be improved, thereby improving the bifaciality of the solar cell.

An embodiment of the present disclosure further provides a tandem solar cell. The tandem solar cell includes the solar cell in the foregoing embodiments. A tandem solar cell provided in another embodiment of the present disclosure is described in detail below with reference to the accompanying drawings. It should be noted that parts that are the same as or correspond to those in the foregoing embodiments are not described herein again.

Figure 12:
FIG. 12 is a sectional view of a partial structure of a tandem solar cell according to another embodiment of the present disclosure.

FIG. 12 is a sectional view of a partial structure of a tandem solar cell according to another embodiment of the present disclosure.

With reference to FIG. 2 and FIG. 12, the tandem solar cell 106 includes: a bottom cell 116 being the solar cell in any one of the foregoing embodiments; and a top cell 126 formed on a side of the doped conductive layer 103 in the bottom cell 116 away from the substrate 100.

In some embodiments, with reference to FIG. 2, FIG. 11, and FIG. 12, the substrate 100 further has a second surface 160 opposite to the first surface 110. The top cell 126 is formed on a side of the first surface 110 away from the second surface 160.

In some examples, with reference to FIG. 2 and FIG. 12, the bottom cell 116 may only include the substrate 100 having the first surface 110, and the dielectric layer 104 and the doped conductive layer 103 that are sequentially stacked on the first surface 110. Based on this, the dielectric layer 104, the doped conductive layer 103, and a part of the first surface 110 not covered by the dielectric layer 104 and the doped conductive layer 103 together form a surface, and the top cell 126 is directly formed on this surface. In an example, the tandem solar cell may further include: a composite layer formed between a surface and the top cell 126, where the surface is formed by the dielectric layer 104, the doped conductive layer 103, and a part of the first surface 110 not covered by the dielectric layer 104 and the doped conductive layer 103.

In some other examples, with reference to FIG. 11 and FIG. 12, in the case where the bottom cell 116 includes the substrate 100 having the first surface 110, and the dielectric layer 104 and the doped conductive layer 103 that are sequentially stacked on the first surface 110, the bottom cell 116 may further include: a first passivation layer 105 formed over the first surface 110 where the dielectric layer 104 and the doped conductive layer 103 are formed; and first electrodes 107 formed on a side of the first passivation layer 105 away from the substrate 100. The first electrodes 107 penetrate the first passivation layer 105 to be in electrical contact with the doped conductive layer 103. In other words, the top cell 126 is located on the side of the first passivation layer 105 away from the substrate 100 and covers a surface of the first passivation layer 105 and a surface of each first electrode 107.

In some embodiments, the top cell 126 may include a first transport layer, a perovskite substrate, a second transport layer, a transparent conductive layer, and an anti-reflection layer that are stacked. The first transport layer faces the bottom cell 116.

In some embodiments, the first transport layer may be one of an electron transport layer and a hole transport layer. The second transport layer may be the other one of the electron transport layer and the hole transport layer.

A still another embodiment of the present disclosure further provides a method for preparing a solar cell, configured to prepare the solar cell provided in the foregoing embodiments. The method for preparing a solar cell provided in the still another embodiment of the present disclosure is described in detail below with reference to the accompanying drawings. It should be noted that parts that are the same as or correspond to those in the foregoing embodiments are not described herein again.

FIG. 13 to FIG. 20 are sectional views of partial structures corresponding to operations in a method for preparing a solar cell according to a still another embodiment of the present disclosure.

With reference to FIG. 13 to FIG. 20, the method for preparing a solar cell includes the following operations.

Figure 13:
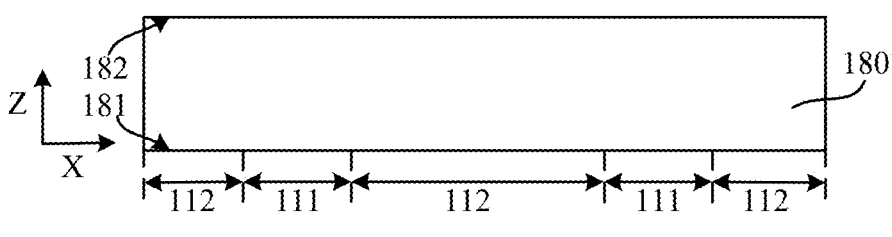
FIGS. 13 to 20 are sectional views of partial structures corresponding to operations in a method for preparing a solar cell according to a still another embodiment of the present disclosure.

In S101, with reference to FIG. 13, an initial substrate 180 having an initial first surface 181 is provided, where the initial first surface 181 includes initial electrode regions 111 and initial non-electrode regions 112 that are alternatingly arranged along a first direction X.

In some embodiments, with reference to FIG. 13, the initial substrate 180 further has an initial second surface 182 opposite to the initial first surface 181. with reference to FIG. 13 and FIG. 5, before forming an initial dielectric layer 114 in a subsequent process, the method may further include: subjecting the initial second surface 182 to second texturing processing such that the initial second surface 182 is transformed into a second surface 160 having a third surface structure 170 including a plurality of second pyramid structures 170a.

In some cases, after first pyramid structures are formed subsequently based on the initial first surface 181, a one-dimensional size L1 of a bottom of a respective first pyramid structure is smaller than a one-dimensional size L2 of a bottom of a respective second pyramid structure 170a.

Figure 14:
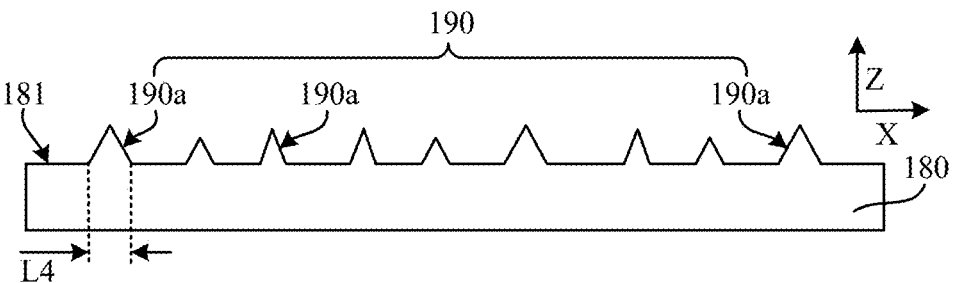

In some cases, with reference to FIG. 13 and FIG. 14 (FIG. 14 is a sectional view of a partial enlarged structure of an initial substrate 180 subjected to second texturing processing in a method for preparing a solar cell according to a still another embodiment of the present disclosure), in the operation of subjecting the initial second surface 182 to the second texturing processing, the initial first surface 181 is also subjected to the second texturing processing such that the initial first surface 181 has an initial first surface structure 180, where the initial first surface structure 180 includes third pyramid structures 190a.

It is worth noting that the second pyramid structures 170a and the third pyramid structures 190a are formed simultaneously through the second texturing processing. Therefore, the one-dimensional size L2 of the bottom of the respective second pyramid structure 170a and a one-dimensional size L4 of a bottom of a respective third pyramid structure 190a are similar. Moreover, forming the second pyramid structures 170a and the third pyramid structures 190a in the same process operation can reduce the technological process. In addition, the third pyramid structures 190a provide a basis for allowing, in subsequently forming the first surface, the electrode regions to have a surface topography including a plurality of platform structures and a part of the respective non-electrode region to have a surface topography including a plurality of first pyramid structures.

It should be noted that the definition of the one-dimensional size L4 of the bottom of the third pyramid structure 190a is also similar to that of the one-dimensional size of the bottom of the first pyramid structure in the foregoing embodiments. Details are not described herein again. In addition, one-dimensional sizes L4 of bottoms of different third pyramid structures 190a may be different or the same, but are within a numerical range.

In some embodiments, after the second texturing processing is performed, before the initial dielectric layer is formed in a subsequent process, the method may further include the following operations.

An emitter is formed in a region of the initial substrate 180 close to the second surface 160. The initial substrate 180 exposes a top surface of the emitter. The top surface of the emitter coincides with the second surface 160. A type of a doping element of the emitter is different from a type of a doping element of the initial substrate 180, so that the emitter finally forms a PN junction with the substrate.

In some examples, the emitter may have a diffused sheet resistance of 80 Ω/sq to 200 Ω/sq.

In some examples, a method for forming the emitter may include: subjecting the second surface 160 to a first doping process to diffuse doping elements into a part of the initial substrate 180 to form the emitter. In an example, the first doping process may be any one of an ion implantation process or a source diffusion process.

It is worth noting that in some cases, when the initial substrate 180 is an N-type substrate, boron diffusion processing may be performed on the second surface 160. In some other cases, when the initial substrate 180 is a P-type substrate, phosphorus diffusion processing may be performed on the second surface 160.

It should be noted that in the operation of subjecting the second surface 160 to the first doping process to form the emitter, taking as an example in which the boron diffusion processing is performed, borosilicate glass is easily formed on the surface of the initial substrate 180. The surface of the initial substrate 180 with the borosilicate glass formed includes, but is not limited to, the initial first surface 181, a side surface of the initial substrate 180, and the second surface 160. Therefore, it is necessary to at least remove, with chain hydrofluoric acid, the borosilicate glass on the initial first surface 181 and the side surface of the initial substrate 180.

Similarly, in the operation of subjecting the second surface 160 to the phosphorus diffusion processing to form the emitter, phosphosilicate glass is easily formed on the surface of the initial substrate 180, and it is also necessary to at least remove the phosphosilicate glass on the initial first surface 181 and the side surface of the initial substrate 180.

Figure 15:
Figure 16:
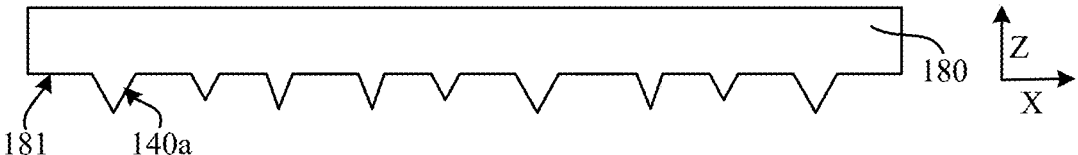

In S102, with reference to FIGS. 14 to 16, the initial first surface 181 is subjected to first polishing processing and first texturing processing such that the initial first surface 181 has a plurality of first pyramid structures 140a.

In some cases, with reference to FIG. 14 and FIG. 15 (FIG. 15 is a sectional view of a partial enlarged structure of an initial first surface 181 subjected to the first polishing processing in a method for preparing a solar cell according to a still another embodiment of the present disclosure), in the operation of subjecting the initial first surface 181 to the first polishing processing, the third pyramid structures 190a are removed to obtain the initial first surface 181 with a surface topography including polished structures 190b. With reference to FIG. 15 and FIG. 16 (FIG. 16 is a sectional view of a partial enlarged structure of the initial first surface 181 subjected to first polishing processing and first texturing processing in a method for preparing a solar cell in accordance with a still another embodiment of the present disclosure), the initial first surface 181 is then subjected to the first texturing processing such that the initial first surface 181 includes a plurality of first pyramid structures 140a.

It should be noted that in the operation of subjecting the initial first surface 181 to the first polishing processing, the third pyramid structures 190a are gradually etched from the pyramid tip to finally obtain the initial first surface 181 with a surface topography including polished structures 190b.

Figure 17:
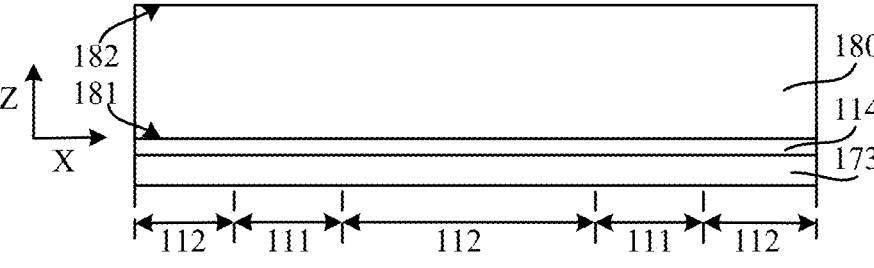

In S103, with reference to FIG. 13 and FIG. 17, an initial dielectric layer 114 is formed over the initial first surface 181. In S104, with continued reference to FIG. 15, an initial doped conductive layer 173 is formed over a surface of the initial dielectric layer 114 away from the initial substrate 180.

In some embodiments, with continued reference to FIG. 17, the operation of forming the initial doped conductive layer 173 may further include: forming a second doped conductive layer (not shown) over the second surface 160. A type of a doping element in the initial doped conductive layer 173 is the same as a type of a doping element in the second doped conductive layer. In other words, the initial doped conductive layer 173 and the second doped conductive layer are formed in the same process operation.

In some embodiments, forming the initial doped conductive layer 173 and the second doped conductive layer may include the following operations.

A first deposition process is performed on the second surface 160 and the textured initial first surface 181 simultaneously to form a first amorphous silicon layer (not shown) over the surface of the initial dielectric layer 114 away from the initial substrate 180 and form a second amorphous silicon layer (not shown) on the second surface 160. For example, the first amorphous silicon layer and the second amorphous silicon layer may be formed by a plasma chemical vapor deposition method.

Crystallization processing is simultaneously performed on the first amorphous silicon layer and the second amorphous silicon layer to convert the first amorphous silicon layer into a first polysilicon layer (not shown) and convert the second amorphous silicon layer into a second polysilicon layer (not shown). In some embodiments, the crystallization processing includes thermal annealing processing on the first amorphous silicon layer and the second amorphous silicon layer.

After the first polysilicon layer and the second polysilicon layer are formed, a second doping process is performed on the first polysilicon layer and the second polysilicon layer such that the first polysilicon layer is converted into the initial doped conductive layer 173 and the second polysilicon layer is converted into the second doped conductive layer.

In some embodiments, the second doping process may be any one of an ion implantation process or a source diffusion process.

In some embodiments, an element doped into a target object in the first doping process is different from an element doped into a target object in the second doping process.

In an example, a doping element used in the first doping process is boron, and a doping element used in the second doping process is phosphorus.

In an example, a doping element used in the second doping process is phosphorus. After the second doping process, phosphosilicate glass is formed on both the initial doped conductive layer 173 and the second doped conductive layer, and both the second doped conductive layer and the phosphosilicate glass are removed in subsequent operations.

Figure 18:
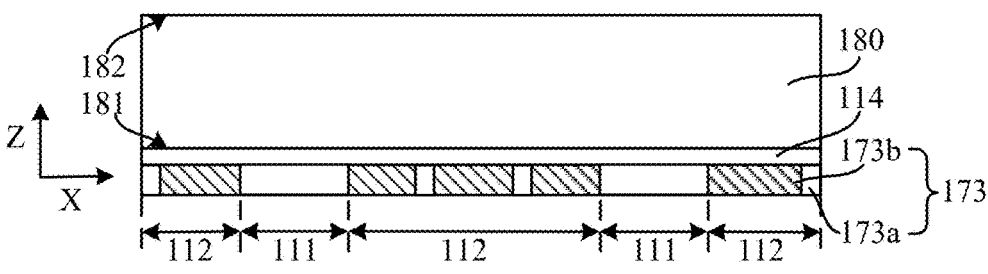

In S105, with reference to FIG. 17 and FIG. 18, a part of the initial doped conductive layer 173 located in at least part of each respective initial non-electrode region 112 is subjected to a laser process.

It should be noted that to clearly illustrate the part of the initially doped conductive layer 173 subjected to the laser process and a part of the initially doped conductive layer 173 not subjected to the laser process, in FIG. 18, the part of the initially doped conductive layer 173 subjected to the laser process is exemplarily denoted by 173b, the part of the initial doped conductive layer 173 not subjected to the laser process is exemplarily denoted by 173b, and the two parts 173a and 173b are drawn in different filling manners. In other words, the part of the initially doped conductive layer 173 not subjected to the laser process may be regarded as the first doped conductive layer 173a, and the part of the initial doped conductive layer 173 subjected to the laser process may be regarded as the second doped conductive layer 173b. The part of the initial doped conductive layer 173 not subjected to the laser process, i.e., the first doped conductive layer 173a, is remained in the subsequent process to serve as a doped conductive layer. The part of the initial doped conductive layer 173 subjected to the laser process, i.e., the second doped conductive layer 173b, is removed in the subsequent process.

In some embodiments, in the operation of forming the initial doped conductive layer 173, a second doped conductive layer covering the second surface 160 and phosphosilicate glass located on the initial doped conductive layer 173 and the second doped conductive layer are also formed. In the operation of subjecting the initial doped conductive layer 173 located in the at least part of the respective initial non-electrode region 112 to the laser process, the entire second doped conductive layer is subjected to the laser process, so that a material property of the entire second doped conductive layer changes, and a material property of the part of the initially doped conductive layer 173 subjected to the laser process changes. In this way, the material property of the part of the initially doped conductive layer 173 subjected to the laser process is different from the material property of the part of the initially doped conductive layer 173 not subjected to the laser process, facilitating, in the subsequent process, removal of the part of the initially doped conductive layer 173 located in the at least part of the respective initial non-electrode region 112 and subjected to the laser process.

Figure 19:
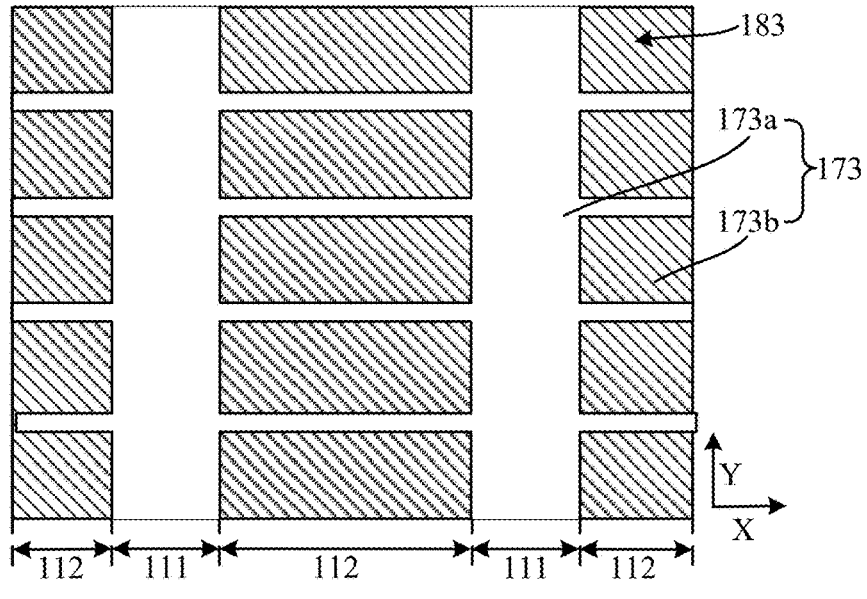

In some embodiments, with reference to FIG. 19, the initial doped conductive layer 173 located in the initial non-electrode regions 112 is divided into a plurality of laser-active regions 183 arranged at intervals along the second direction Y. It is worth noting that with reference to FIG. 19 and FIG. 1, each laser-active region 183 corresponds to a spacing between adjacent first strip-shaped structures 133 subsequently formed, so as to form the second conductive portions 123 shown in FIG. 5 by means of the laser-active regions 183.

Figure 20:
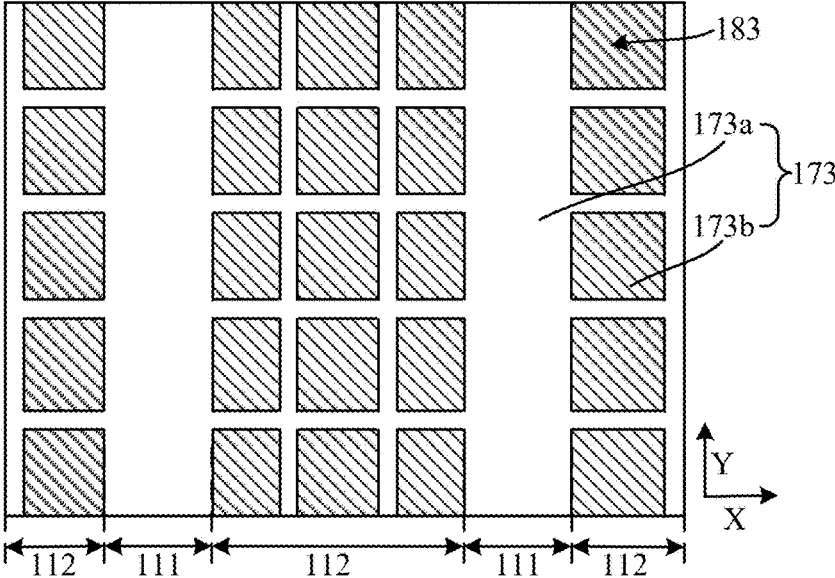

In some other embodiments, with reference to FIG. 20, a plurality of laser-active regions 183 are arranged at intervals along both the first direction X and the second direction Y, where the first direction X intersects the second direction Y. It is worth noting that with reference to FIG. 20 and FIG. 9, the laser-active regions 183 correspond to mesh holes 163 of a grid structure 153 formed by intersection of a plurality of second strip-shaped structures 143 and a plurality of first strip-shaped structures 133 that are formed in subsequent process, so as to form the grid structure 153 shown in FIG. 9 by means of the laser-active regions 183.

It should be noted that the above are only two embodiments of finally forming first conductive portions 113 and second conductive portions 123. In practical application, by designing the specific appearance of the laser-active regions 183, the second conductive portions 123 as shown in FIG. 8 and FIG. 10 may also be formed. Furthermore, FIG. 19 is a top view of a structure of the initial doped conductive layer 173 subjected to a laser process, and FIG. 20 is a top view of another structure of the initial doped conductive layer 173 subjected to a laser process. To clearly show the part of the initially doped conductive layer 173 subjected to the laser process and the part of the initially doped conductive layer 173 not subjected to the laser process, in FIG. 19 and FIG. 20, the part of the initially doped conductive layer 173 subjected to the laser process is exemplarily denoted by 173b, the part of the initial doped conductive layer 173 not subjected to the laser process is exemplarily denoted by 173a, and the two parts 173a and 173b are drawn in different filling manners.

Then, the operation of subjecting the part of the initial doped conductive layer 173 located in the at least part of each respective initial non-electrode region 112 to the laser process includes: subjecting a part of the initial doped conductive layer 173 located in the laser-active regions 183 to a laser process, a remaining part of the initially doped conductive layer 173 not subjected to the laser process serving as a doped conductive layer subsequently.

In some embodiments, a laser used in the laser process is a picosecond laser. A wavelength of the laser may be 300 nm to 1000 nm, for example, 400 nm, 500 nm, 600 nm, 700 nm, 800 nm, or 900 nm.

In some embodiments, spot energy density of the laser used in the laser process may be 103 $W/cm^2$ to 106 $W/cm^2$, for example, 103.5 $W/cm^2$, 104 $W/cm^2$, 104.5 $W/cm^2$, 105 $W/cm^2$, or 105.5 $W/cm^2$.

In some embodiments, a line width of the laser used in the laser process may be 80 μm to 1500 μm, for example, 100 μm, 300 μm, 500 μm, 600 μm, 700 μm, 850 μm, 900 μm, 1000 μm, 1100 μm, 1200 μm, 1300 μm, or 1400 μm.

In S106, with reference to FIG. 16, FIG. 18 and FIG. 3, the part of the initial doped conductive layer 173 subjected to the laser process and a corresponding part of the initial dielectric layer 114 are removed by an etching process such that first pyramid structures 140a on an exposed part of the initial first surface 181 is transformed into platform structures 150a. A remaining part of the initial dielectric layer 114 located in the electrode regions 101 and the non-electrode regions 102 is a dielectric layer 104, and a remaining part of the initial doped conductive layer 173 located in the electrode regions 101 and the non-electrode regions 102 is a doped conductive layer 103.

It is worth noting that with reference to FIG. 16, FIG. 18 and FIG. 3, in the operation of removing the part of the initial doped conductive layer 173 subjected to the laser process and the corresponding part of the initial dielectric layer 114, the first pyramid structures 140a on the exposed part of the initial first surface 181 may also be etched slightly to transform the first pyramid structures 140*a* on the exposed part of the initial first surface 181 into the platform structures 150*a*.

In some embodiments, in the operation of forming the initial doped conductive layer 173, a second doped conductive layer covering the second surface 160 is also formed, and a laser process is performed on the entire second doped conductive layer. Based on this, in the operation of removing, by the etching process, the part of the initial doped conductive layer 173 subjected to the laser process and the corresponding part of the initial dielectric layer 114, the second doped conductive layer and phosphosilicate glass located on the initial doped conductive layer 173 and the second doped conductive layer are also removed.

In some embodiments, the process of removing the part of the initial doped conductive layer 173 subjected to the laser process and the corresponding part of the initial dielectric layer 114 by the etching process may be alkaline etching, and an etching solution for the alkaline etching may be a mixed solution including potassium hydroxide and a texturing additive.

It is worth noting that with reference to FIG. 3 and FIG. 4, the finally formed first surface 110 includes a first part 120 aligned with the doped conductive layer 103 and a second part 130 not aligned with the doped conductive layer 103, the first part 120 has a first surface structure 140 including a plurality of first pyramid structures 140*a*, and the second part 130 has a second surface structure 150 including a plurality of platform structures 150*a*.

In some embodiments, with reference to FIG. 11, after the dielectric layer 104 and the doped conductive layer 103 are formed, the method may further include: forming a first passivation layer 105 over the first surface 110 where the dielectric layer 104 and the doped conductive layer 103 are formed; and forming a second passivation layer 115 over the second surface 160.

In some cases, the first passivation layer 105 and the second passivation layer 115 may be formed simultaneously by a deposition process.

In some examples, each of the first passivation layer 105 and the second passivation layer 115 may be of a stacked structure. For example, an aluminum oxide film may grow on each of the first surface 110 and the second surface 160 by an atomic layer deposition process. Then, one or more of silicon oxide, silicon nitride, and silicon oxynitride is deposited on the aluminum oxide film by a plasma-enhanced chemical vapor deposition process to form a composite film layer.

In some embodiments, with reference to FIG. 11, after the dielectric layer 104 and the doped conductive layer 103 are formed, the method may further include: forming first electrodes 107 penetrating the first passivation layer 105 to be in electrical contact with the doped conductive layer 103; and forming second electrodes 117 penetrating the second passivation layer 115 to be in electrical contact with the second surface 160.

In some cases, the first electrodes 107 and the second electrodes 117 may be formed by a screen printing process.

In some cases, the first electrodes 107 and/or the second electrodes 117 are sintered, and a sintering temperature may be 700° C. to 800° C., for example, 720° C., 750° C., 820° C., or 840° C., which is beneficial to the first electrodes 107 having a good ohmic contact with the doped conductive layer 103, and the second electrodes 117 having a good ohmic contact with the second surface 160.

In conclusion, in still another embodiment of the present disclosure, the surface of the initial substrate 180 is first subjected to first texturing processing to provide a basis for the subsequent formation of the first part 120 having the first pyramid structures 140*a*. After the initial dielectric layer 114 and the initial doped conductive layer 173 are formed on the surface having the first pyramid structures 140*a*, the initial doped conductive layer 173 located in a part in the initial non-electrode regions 112 is subjected to a laser process, the part of the initial doped conductive layer 173 subjected to the laser process and a corresponding part of the initial dielectric layer 114 are removed by an etching process, and first pyramid structures 140*a* on an exposed part of the initial first surface 181 is etched such that the first pyramid structures 140*a* on the exposed part of the initial first surface 181 is transformed into platform structures 150*a*, to form a second part 130 having platform structures 150*a*. A remaining part of the initial first surface 181 that is not etched by the etching process is a first part 120 having the first pyramid structures 140*a*, so that a substrate having the first surface 110 is formed. A remaining part of the initial dielectric layer 114 located in the electrode regions 101 and the non-electrode regions 102 is a dielectric layer 104, and a remaining part of the initial doped conductive layer 173 located in the electrode regions 101 and the non-electrode regions 102 is a doped conductive layer 103.

Figures 21, 22:
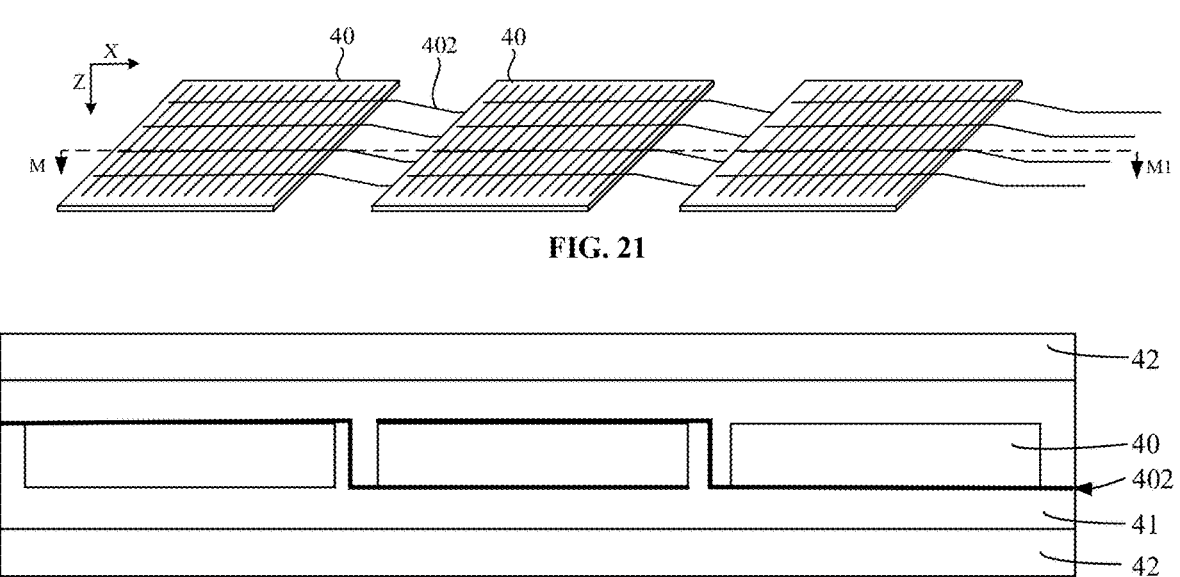
FIG. 21 is a perspective view of a partial structure of a photovoltaic module according to a yet another embodiment of the present disclosure.
FIG. 22 is a sectional view taken along MM1 in FIG. 21.

Yet another embodiment of the present disclosure further provides a photovoltaic module. The photovoltaic module includes a plurality of cell strings, each formed by connecting the solar cells in any one of the foregoing embodiments, or connecting tandem solar cells in the foregoing embodiments. The photovoltaic module is configured to convert received light energy into electrical energy. FIG. 21 is a perspective view of a partial three-dimensional structure of a photovoltaic module according to a yet another embodiment of the present disclosure. FIG. 22 is a sectional view taken along MM1 in FIG. 21. It should be noted that for parts that are the same as or correspond to those in the foregoing embodiments, refer to corresponding descriptions of the foregoing embodiments. Details are not described below.

With reference to FIG. 21 and FIG. 22, the photovoltaic module includes: a cell string, an encapsulating film 41, and a cover plate 42. The cell string is formed by connecting the solar cells 40 in the foregoing embodiments, connecting tandem solar cells 106 (with reference to FIG. 12) in the foregoing embodiments, or connecting the solar cells prepared by the method in the foregoing embodiments. The encapsulating film 41 is configured to cover a surface of the cell string. The cover plate 42 is configured to cover a surface of the encapsulating film 41 facing away from the cell string. The solar cells 40 are electrically connected in a form of a whole slice or a plurality of slices to form a plurality of cell strings. The plurality of cell strings are electrically connected in a series and/or in parallel connection manner.

In some embodiments, with reference to FIG. 22, a plurality of cell strings may be electrically connected via a conductive band 402. FIG. 22 shows merely a position relationship of solar cells. That is, arrangement directions of electrodes with a same polarity of cells are the same or electrodes including a positive polarity of cells are arranged toward a same side, so that the conductive band respectively connects different sides of two adjacent cells. In some embodiments, the cells may alternatively be arranged according to a sequence that electrodes with different polarities face toward a same side, that is, electrodes of a plurality of adjacent cells are sequentially sorted according to a sequence of a first polarity, a second polarity, and the first polarity, and the conductive band connects two adjacent cells on a same side.

In some embodiments, no interval is provided between the cells, that is, the cells are overlapped with each other.

In some embodiments, the encapsulating film 41 includes a first encapsulation layer and a second encapsulation layer, where the first encapsulation layer covers one of a front surface and a back surface of the solar cell 40, and the second encapsulation layer covers the other of the front surface and the back surface of the solar cell 40. Specifically, at least one of the first encapsulation layer and the second encapsulation layer may be an organic encapsulation glue film such as a polyvinyl butyral (PVB) glue film, an ethylene-vinyl acetate copolymer (EVA) glue film, a polyolefin elastomer (POE) glue film, or a polyethylene glycol terephthalate (PET) glue film.

In some cases, a boundary exists between the first encapsulation layer and the second encapsulation layer before lamination, and after the photovoltaic module is formed through lamination processing, concepts of the first encapsulation layer and the second encapsulation layer do not exist, that is, the first encapsulation layer and the second encapsulation layer have formed the entire encapsulation glue film 41.

In some embodiments, the cover plate 42 may be a cover plate with a light-transmitting function such as a glass cover plate or a plastic cover plate. Specifically, a surface of the cover plate 42 facing the encapsulation glue film 41 may be an uneven surface, to increase the utilization of incident light. The cover plate 42 includes a first cover plate and a second cover plate. The first cover plate is covered on a side of the first encapsulation layer facing away from the cell string, and the second cover plate is covered on a side of the second encapsulation layer facing away from the cell string.

In some embodiments, the solar cell includes, but is not limited to, any one of a PERC cell, a TOPCON cell, a heterojunction technology (HIT/HJT) cell a perovskite cell, or a tandem solar cell. The tandem solar cell includes, but is not limited to, a perovskite cell laminated with a crystalline silicon cell, a perovskite a perovskite cell, and a perovskite cell laminated with a thin film cell.

The solar cell may be a monocrystalline silicon solar cell, a polycrystalline silicon solar cell, an amorphous silicon solar cell, or a multicomponent compound solar cell. The multicomponent compound solar cell may be specifically a cadmium sulphide solar cell, a gallium arsenide solar cell, a copper indium selenide solar cell, or a perovskite solar cell. In addition, the solar cell may be an integral cell or a sliced cell. The sliced cell refers to a cell formed by cutting a complete and integral cell.

In some embodiments, with reference to FIG. 21, solar cells 40 in the cell string are arranged along the first direction X. Busbars of two adjacent solar cells 40 in the cell string are staggered in the third direction Z. For the photovoltaic module, through providing the busbars of two adjacent solar cells 40 in the cell string to be staggered in the third direction Z, different potentials of the photovoltaic module can be tested, thereby improving the reliability of test results.

A person of ordinary skill in the art may understand that the above-mentioned implementations are specific embodiments for implementing the present disclosure. In practical application, various modifications can be made in forms and details without departing from the spirit and scope of the embodiments of the present disclosure. A person skilled in the art can make various modifications and variations without departing from the spirit and the scope of embodiments of the present disclosure. Therefore, protection scope of embodiments of the present disclosure should be subject to the defined by the claims.

What is claimed is:

1. A solar cell, comprising:
   a substrate having a first surface, wherein the first surface includes electrode regions and non-electrode regions that are alternatingly arranged along a first direction;
   a doped conductive layer formed over the first surface of the substrate, the doped conductive layer including first conductive portions and at least one second conductive portion, each first conductive portion of the first conductive portions being formed over a respective electrode region of the electrode regions, each respective second conductive portion of the at least one second conductive portion being formed over a part of a non-electrode region of the non-electrode regions; and
   a dielectric layer between the first surface and the doped conductive layer,
   wherein the first surface includes a first area aligned with the doped conductive layer and at least one second area not aligned with the doped conductive layer, the first area has a first surface structure including a plurality of first pyramid structures, and each of the at least one second area has a second surface structure including a plurality of platform structures.

2. The solar cell of claim 1, wherein the substrate further has a second surface opposite to the first surface, and the second surface has a third surface structure including a plurality of second pyramid structures.

3. The solar cell of claim 2, wherein a bottom of a respective first pyramid structure of the plurality of first pyramid structures has a one-dimensional size smaller than a one-dimensional size of a bottom of a respective second pyramid structure of the plurality of second pyramid structures.

4. The solar cell of claim 1, wherein a bottom of a respective platform structure of the plurality of platform structures has a one-dimensional size of 5 μm to 20 μm.

5. The solar cell of claim 1, wherein an area of the doped conductive layer covering the first surface is less than or equal to an area of the dielectric layer covering the first surface.

6. The solar cell of claim 1, wherein an area of the first area in the non-electrode regions is 5% to 30% of an area of the first surface.

7. The solar cell of claim 1, wherein the at least one second conductive portion is disposed over only a partial number of the non-electrode regions.

8. The solar cell of claim 1, wherein the first conductive portions are arranged at intervals along the first direction and extend along a second direction intersecting the first direction; and
   wherein the respective second conductive portion is between respective two adjacent first conductive portions of the plurality of first conductive portions and in contact connection with each of the respective two adjacent first conductive portions.

9. The solar cell of claim 8, wherein the at least one second conductive portion is in one-to-one correspondence with the non-electrode regions.

10. The solar cell of claim 8, wherein the respective second conductive portion includes a plurality of first strip-shaped structures arranged at intervals along the second direction, and each of the plurality of first strip-shaped structures extends along the first direction and is in contact connection with the respective two adjacent first conductive portions.

11. The solar cell of claim 10, wherein the respective second conductive portion further includes at least one second strip-shaped structure each extending along the second direction.

12. The solar cell of claim 11, wherein the respective second conductive portion includes a plurality of second strip-shaped structures arranged at intervals along the first direction and intersecting the plurality of first strip-shaped structures to form a grid structure.

13. The solar cell of claim 11, wherein a respective first strip-shaped structure of the plurality of first strip-shaped structures has a first width, a respective second strip-shaped structure of the plurality of second strip-shaped structures has a second width, and a respective first conductive portion of the first conductive portions has a third width, wherein the third width is greater than both the first width and the second width.

14. A tandem solar cell, comprising:
a bottom cell, wherein the bottom cell includes:
    a substrate having a first surface, wherein the first surface includes electrode regions and non-electrode regions that are alternatingly arranged along a first direction;
    a doped conductive layer formed over the first surface of the substrate, the doped conductive layer including first conductive portions and at least one second conductive portion, each first conductive portion of the first conductive portions being formed over a respective electrode region of the electrode regions, each respective second conductive portion of the at least one second conductive portion being formed over a part of a non-electrode region of the non-electrode regions; and
    a dielectric layer between the first surface and the doped conductive layer; and
a top cell, located on a side of the doped conductive layer in the bottom cell away from the substrate, wherein the first surface includes a first area aligned with the doped conductive layer and at least one second area not aligned with the doped conductive layer, the first area has a first surface structure including a plurality of first pyramid structures, and each of the at least one second area has a second surface structure including a plurality of platform structures.

15. The tandem solar cell of claim 14, wherein the substrate further has a second surface opposite to the first surface, and the second surface has a third surface structure including a plurality of second pyramid structures.

16. The tandem solar cell of claim 15, wherein a bottom of a respective first pyramid structure of the plurality of first pyramid structures has a one-dimensional size smaller than a one-dimensional size of a bottom of a respective second pyramid structure of the plurality of second pyramid structures.

17. The tandem solar cell of claim 14, wherein a bottom of a respective platform structure of the plurality of platform structures has a one-dimensional size of 5 μm to 20 μm.

18. The tandem solar cell of claim 14, wherein an area of the doped conductive layer covering the first surface is less than or equal to an area of the dielectric layer covering the first surface.

19. A photovoltaic module, comprising:
at least one cell string, each formed by connecting the solar cells of claim 1;
at least one encapsulating film, each configured to cover a surface of a respective cell string; and
at least one cover plate, each configured to cover a surface of a respective encapsulating film facing away from the respective cell string.

20. A photovoltaic module, comprising:
at least one cell string, each formed by connecting the tandem solar cells of claim 14;
at least one encapsulating film, each configured to cover a surface of a respective cell string; and
at least one cover plate, each configured to cover a surface of a respective encapsulating film facing away from the respective cell string.

\* \* \* \* \*